US012713941B2

(12) United States Patent
Suzuki et al.

(10) Patent No.: US 12,713,941 B2

(45) Date of Patent: Aug. 18, 2026

(54) SEMICONDUCTOR MODULE

(71) Applicant: FUJI ELECTRIC CO., LTD., Kawasaki (JP)

(72) Inventors: Katsunori Suzuki, Matsumoto-city (JP); Keishirou Kumada, Matsumoto-city (JP); Yuichiro Hinata, Matsumoto-city (JP); Ryoichi Kato, Matsumoto-city (JP); Masahide Kamiya, Matsumoto-city (JP); Haruka Kamisuki, Matsumoto-city (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 353 days.

(21) Appl. No.: 18/519,568

(22) Filed: Nov. 27, 2023

(65) Prior Publication Data

US 2024/0250015 A1 Jul. 25, 2024

(30) Foreign Application Priority Data

Jan. 19, 2023 (JP) ................................ 2023-006629

(51) Int. Cl.

| | |
|---|---|
| ***H10W 70/40*** | (2026.01) |
| ***H10W 40/25*** | (2026.01) |
| ***H10W 76/15*** | (2026.01) |
| *H10W 72/00* | (2026.01) |
| *H10W 90/00* | (2026.01) |

(52) U.S. Cl.

CPC ....... *H10W 70/479* (2026.01); *H10W 40/255* (2026.01); *H10W 76/15* (2026.01); *H10W 72/886* (2026.01); *H10W 90/734* (2026.01); *H10W 90/767* (2026.01)

(58) Field of Classification Search

CPC . H10W 70/479; H10W 40/255; H10W 76/15; H10W 72/886; H10W 90/734; H10W 90/767

See application file for complete search history.

(56) References Cited

U.S. PATENT DOCUMENTS

2007/0273022 A1 11/2007 Ozeki et al.
2019/0221449 A1* 7/2019 Trichy Rengarajan ...................... H01L 23/24

FOREIGN PATENT DOCUMENTS

| | | | |
|---|---|---|---|
| JP | 7-321251 | A | 12/1995 |
| JP | 11-354716 | A | 12/1999 |
| JP | 2000-260790 | A | 9/2000 |
| JP | 2001-53222 | A | 2/2001 |
| JP | 2001-141831 | A | 5/2001 |
| JP | 2002-97252 | A | 4/2002 |
| JP | 2006-231762 | A | 8/2006 |
| JP | 2007-134493 | A | 5/2007 |
| JP | 2007-250943 | A | 9/2007 |
| JP | 2014-150204 | A | 8/2014 |

* cited by examiner

*Primary Examiner* — Fernando L Toledo
*Assistant Examiner* — Adam S Bowen

(57) ABSTRACT

A semiconductor module includes a semiconductor unit including a semiconductor chip, a housing for accommodating the semiconductor unit, and a target member bonded to the housing by an adhesive having a water absorption rate of 0.5% or less.

11 Claims, 14 Drawing Sheets

SEMICONDUCTOR MODULE

CROSS REFERENCE TO RELATED APPLICATION

This Application is based on, and claims priority from, Japanese Patent Application No. 2023-006629, filed on Jan. 19, 2023, the entire contents of which are incorporated herein by reference.

BACKGROUND

Technical Field

This disclosure relates to a semiconductor module.

Related Art

Semiconductor modules have been proposed that include a power semiconductor element such as an insulated gate bipolar transistor (IGBT) or a metal oxide semiconductor field effect transistor (MOSFET) as disclosed in (1) Japanese Patent Application Laid-Open Publication No. 2014-150204, (2) Japanese Patent Application Laid-Open Publication No. 2001-053222, (3) Japanese Patent Application Laid-Open Publication No. 2007-134493, (4) Japanese Patent Application Laid-Open Publication No. 2001-141831, (5) Japanese Patent Application Laid-Open Publication No. H7-321251, (6) Japanese Patent Application Laid-Open Publication No. H11-354716, (7) Japanese Patent Application Laid-Open Publication No. 2006-213762, (8) Japanese Patent Application Laid-Open Publication No. 2007-250943, and (9) Japanese Patent Application Laid-Open Publication No. 2000-260790. In addition, semiconductor modules have been proposed that include an optical semiconductor element as disclosed in (10) Japanese Patent Application Laid-Open Publication No. 2002-097252. For example, (6) Japanese Patent Application Laid-Open Publication No. H11-354716 describes a module that includes an AlN substrate on which a semiconductor element is disposed, a module-bottom base fixed to the AlN substrate, and a case for accommodating the semiconductor element. The module-bottom base and the case are bonded to each other by an adhesive. When an adhesive having a high water absorption rate is used to bond a housing (case) to a base exposed to the outside air such as the module-bottom base described in Japanese Patent Application Laid-Open Publication No. H11-354716, detachment of the housing from the base may occur due to moisture absorbed by the adhesive. If moisture infiltrates into a gap formed due to the detachment of the housing from the base, a semiconductor chip in the housing may become degraded. Although the above description focuses on bonding of a housing to a base, the same problem may occur when a freely selected member is bonded to a housing by an adhesive.

SUMMARY

An object of one aspect according to this disclosure is to reduce a probability of an occurrence of detachment of a target member from a housing due to moisture absorbed by an adhesive.

A semiconductor module according to one aspect of the present disclosure includes: a semiconductor unit including a semiconductor chip; a housing for accommodating the semiconductor unit; and a target member bonded to the housing by an adhesive having a water absorption rate of 0.5% or less.

BRIEF DESCRIPTION OF THE DRAWINGS

FIG. 1 is a cross section of a semiconductor module according to a first embodiment.

DESCRIPTION OF EMBODIMENTS

Figure 2:
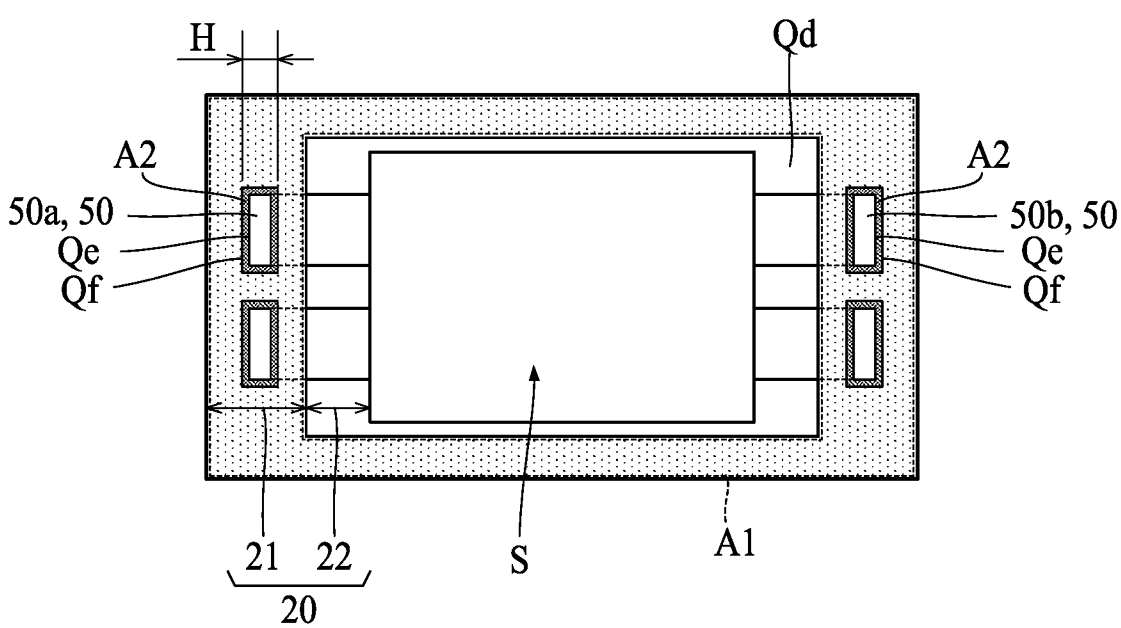
FIG. 2 is a plan view of a housing.

Embodiments according to the present disclosure will now be described with reference to the accompanying drawings. In each drawing, dimensions and scales of elements may differ from those of actual products. In addition, each embodiment described below is an exemplary embodiment assumed in a case in which the present disclosure is implemented. Thus, the scope of the present disclosure is not limited to the embodiments described below.

A: First Embodiment

Figure 1:
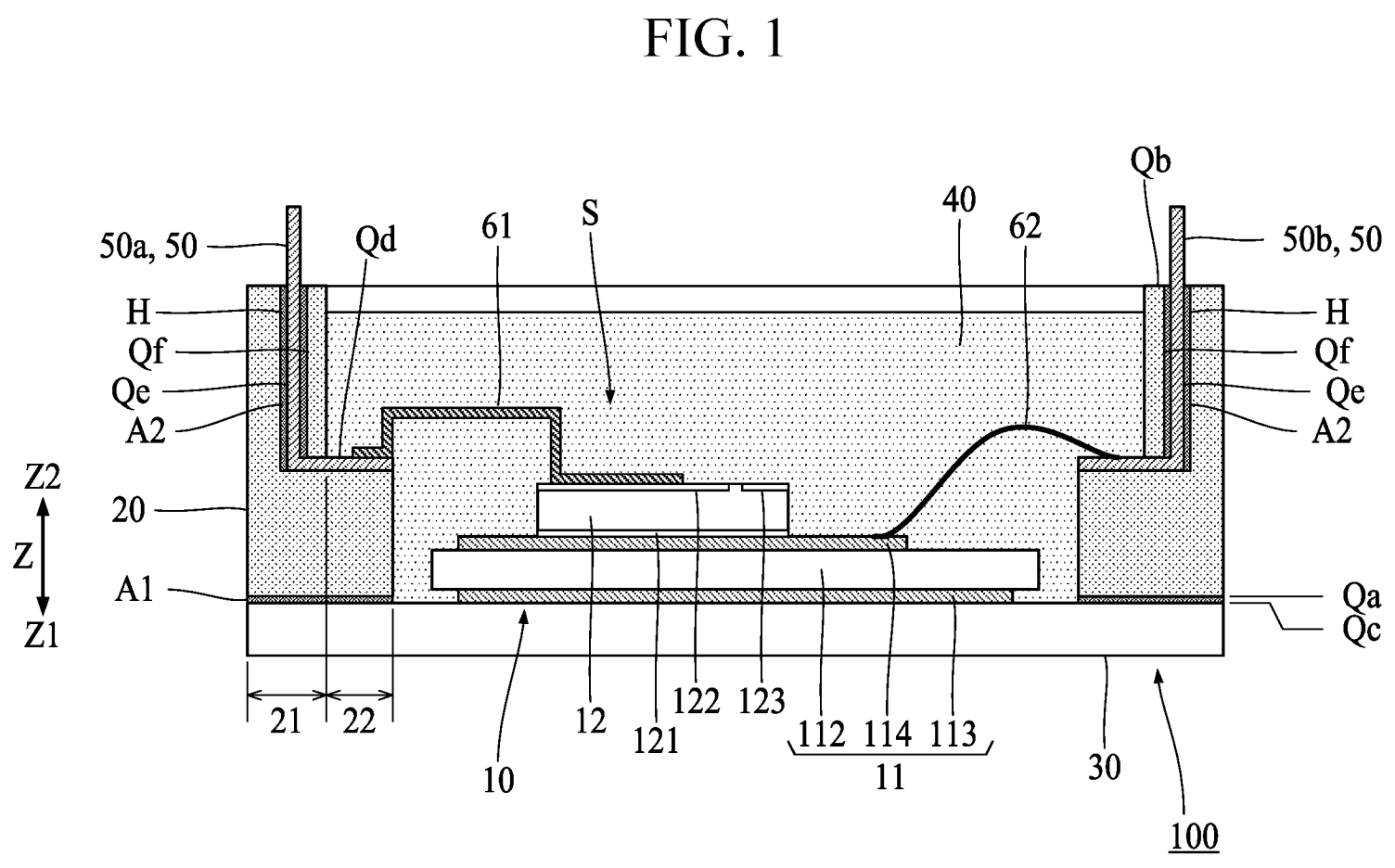

FIG. 1 is a cross section of a semiconductor module 100 according to a first embodiment. The semiconductor module 100 according to the first embodiment is, for example, a power semiconductor device included in a power conversion apparatus such as an inverter circuit. The semiconductor module 100 includes a semiconductor unit 10, a housing 20, a heat radiating plate 30, an encapsulating material 40, a plurality of connection terminals 50, a wiring member 61, and a wire 62.

In the following description, a Z-axis is defined. A direction along the Z-axis is referred to as a direction Z1, whereas a direction opposite to the direction Z1 is referred to as a direction Z2. In actual use, the semiconductor module 100 may be disposed in any direction. However, in the following description, the direction Z1 is assumed to be a downward direction, and the direction Z2 is assumed to be an upward direction, for convenience. Thus, a surface facing in the direction Z1 among a plurality of surfaces of the semiconductor module 100 may be referred to as a "lower surface," whereas a surface facing in the direction Z2 among the plurality of surfaces of the semiconductor module 100 may be referred to as an "upper surface." In the following description, a view in a direction along the Z-axis may be referred to as a "plan view."

The housing 20 is a structure that accommodates and supports the semiconductor unit 10, the encapsulating material 40, the wiring member 61, and the wire 62. The housing 20 is made of an insulating resin material such as a polyphenylene sulfide (PPS) resin material, a polybutylene terephthalate (PBT) resin material, a polybutylene succinate (PBS) resin material, a polyamide (PA) resin material, or an acrylonitrile-butadiene-styrene (ABS) resin material.

FIG. 2 is a plan view of the housing 20. As shown in FIG. 1 and FIG. 2, the housing 20 according to the first embodiment is a structure that has a rectangular frame shape in plan view. The housing 20 includes a side wall portion 21 and a protrusion 22. The side wall portion 21 is a wall-shaped portion that has a rectangular frame shape in plan view. The protrusion 22 is a rectangular frame-shaped portion of the housing 20. The protrusion 22 protrudes inwardly from an inner wall surface of the side wall portion 21. In the following description, a space inside the housing 20 may be referred to as an "internal space S." The internal space S is a space surrounded by the housing 20. As shown in FIG. 1, the housing 20 according to the first embodiment includes a bottom surface facing in the direction Z1 (hereinafter referred to as a "bonding surface Qa") and a top surface facing in the direction Z2 (hereinafter referred to as a "terminal surface Qb"). The bonding surface Qa and the terminal surface Qb are each a rectangular frame-shaped surface that is perpendicular to the Z-axis.

Each of the plurality of connection terminals 50 (50*a*, 50*b*) is a lead wire electrically connected to the semiconductor unit 10. The semiconductor unit 10 is electrically connected to an external device (not shown) via the plurality of connection terminals 50. Each of the plurality of connection terminals 50 is integrally formed together with the housing 20 by insert molding, for example. In other words, the housing 20 and the plurality of connection terminals 50 constitute a single molded member. The plurality of connection terminals 50 includes, for example, a power supply terminal for supplying power to the semiconductor unit 10, and a control terminal for controlling the semiconductor unit 10. Each of the plurality of connection terminals 50 is made of a low-resistance conductive material such as a copper material or an alloy of copper, etc. A connection terminal 50 that is separate from the housing 20 may be disposed in the housing 20. The plurality of connection terminals 50 includes a connection terminal 50*a* and a connection terminal 50*b*.

In FIG. 1, the heat radiating plate 30 is a rectangular base on which the semiconductor unit 10 is disposed. The heat radiating plate 30 is made of a conductive material such as an aluminum material or a copper material, etc. The semiconductor unit 10 generates heat. The heat radiating plate 30 functions as a cooler for radiating away the heat generated by the semiconductor unit 10. The heat radiating plate 30 may be used as a grounding body that is set at a ground potential. The heat radiating plate 30 is an example of a "base" in the present disclosure.

The heat radiating plate 30 includes a surface facing in the direction Z2 (hereinafter referred to as a "mounting surface Qc"). The bonding surface Qa of the housing 20 and the mounting surface Qc of the heat radiating plate 30 face each other. The housing 20 and the heat radiating plate 30 are bonded to each other by an adhesive A1 provided between the bonding surface Qa and the mounting surface Qc. In FIG. 2, the adhesive A1 is depicted by use of hatching. As will be understood from FIG. 2, the adhesive A1 is provided in a rectangular frame shape on the bonding surface Qa. The adhesive A1 is an example of a "first adhesive" in the present disclose.

The adhesive A1 is made of a resin material having a water absorption rate of 0.5% or less in a cured state. The water absorption rate (%) is obtained by multiplying a ratio (Δm/m1) by 100, where m1 indicates a mass of a sample before absorption of water, and Δm indicates a mass of water absorbed by the sample under predetermined conditions. The mass of water absorbed by the sample is a difference between m2 and m1 (Δm=m2−m1), where m2 indicates a mass of the sample after absorption of water, and m1 indicates a mass of the sample before absorption of water as described above. The predetermined condition is, for example, a condition in which the sample has been immersed in water at 23 degrees Celsius for 24 hours (Method A). A water absorption rate is defined by Japanese Industrial Standard (JIS) K 7209:2000 (ISO 62:1999).

The encapsulating material 40 is an insulating material filled in the internal space S that is formed by the housing 20 and by the heat radiating plate 30. The encapsulating material 40 encapsulates the semiconductor unit 10, the wiring member 61, and the wire 62. The encapsulating material 40 is made of a resin material such as an epoxy resin material. The encapsulating material 40 may include various fillers that are made of a silicon oxide material or that are made of an aluminum oxide material, for example.

The semiconductor unit 10 includes a mounting substrate 11 and a semiconductor chip 12. The mounting substrate 11 is a rectangular plate-shaped member. For example, the mounting substrate 11 may be a substrate such as a direct copper bonding (DCB) substrate, an active metal brazing (AMB) substrate, or an insulated metal substrate (IMS), etc.

The mounting substrate 11 is constituted by a stack of an insulating substrate 112, a metallic layer 113, and a conductive pattern 114. The insulating substrate 112 is a rectangular plate-shaped member made of an insulating material. The insulating substrate 112 is made of a ceramic material such as aluminum oxide, aluminum nitride, or silicon nitride, etc. Alternatively, the insulating substrate 112 may be made of a resin material such as an epoxy resin material.

The metallic layer 113 is a rectangular plate-shaped member fixed to a lower surface of the insulating substrate 112. The metallic layer 113 is made of, for example, a metallic material with high thermal conductivity such as a copper material, or an aluminum material, etc. The metallic layer 113 transfers heat generated by the semiconductor chip 12 to the heat radiating plate 30. The metallic layer 113 has a lower surface fixed to the mounting surface Qc of the heat radiating plate 30 by a joining material such as solder or a sintering material, etc. As shown in FIG. 1, the semiconductor unit 10 is disposed in the internal space S of the housing 20. In other words, the housing 20 according to the first embodiment is a frame-shaped member surrounding the semiconductor unit 10.

The conductive pattern 114 is a conductor disposed on an upper surface of the insulating substrate 112. The conductive pattern 114 is made of a low-resistance conductive material such as a copper material or an alloy of copper, etc.

The semiconductor chip 12 is a power semiconductor element disposed on the mounting substrate 11. The semiconductor chip 12 is fixed to the conductive pattern 114 by a conductive joining material such as solder or a sintering material, etc. The semiconductor chip 12 according to the first embodiment is a metal oxide semiconductor field effect transistor (MOSFET) having a semiconductor layer made of a silicon carbide (SiC) material. Although a plurality of semiconductor chips 12 may be actually disposed on the mounting substrate 11, only one semiconductor chip 12 is shown in FIG. 1 for convenience.

The semiconductor chip 12 includes a first main electrode 121, a second main electrode 122, and a control electrode 123. The first main electrode 121 and the second main electrode 122 are electrodes that receive and output a current as a control target. The first main electrode 121 is a drain electrode that constitutes a lower surface of the semiconductor chip 12. The first main electrode 121 is fixed to the conductive pattern 114. The second main electrode 122 is a source electrode that constitutes an upper surface of the semiconductor chip 12. The control electrode 123 is a gate electrode to which a control voltage is applied for control to turn the semiconductor chip 12 on and off. The control electrode 123 constitutes the upper surface of the semiconductor chip 12 together with the second main electrode 122.

The wiring member 61 is a thin plate-shaped conductor (lead frame) for electrically connecting the connection terminal 50*a* to the semiconductor chip 12. The wiring member 61 is made of a low-resistance conductive material such as a copper material or an alloy of copper, etc. One end of the wiring member 61 is coupled to the second main electrode 122 of the semiconductor chip 12 by a joining material such as solder or a sintering material, etc. The other end of the wiring member 61 is coupled to the connection terminal 50*a* by ultrasonic bonding, for example. The connection terminal 50*a* is a connection terminal 50 of the plurality of connection terminals 50. The connection terminal 50*a* is electrically connected to the semiconductor chip 12 via the wiring member 61. The wiring member 61 may electrically connect the connection terminal 50 to the conductive pattern 114.

The wire 62 is a linear conductor that electrically connects the connection terminal 50*b* to the conductive pattern 114. The wire 62 is made of a low-resistance conductive material such as a copper material or an alloy of copper, etc. One end of the wire 62 is coupled to the connection terminal 50*b* by ultrasonic bonding, for example. The other end of the wire 62 is coupled to the conductive pattern 114 by ultrasonic bonding, for example. The connection terminal 50*b* is a connection terminal 50 of the plurality of connection terminals 50. The connection terminal 50*b* is electrically connected to the conductive pattern 114 via the wire 62.

Figure 3:
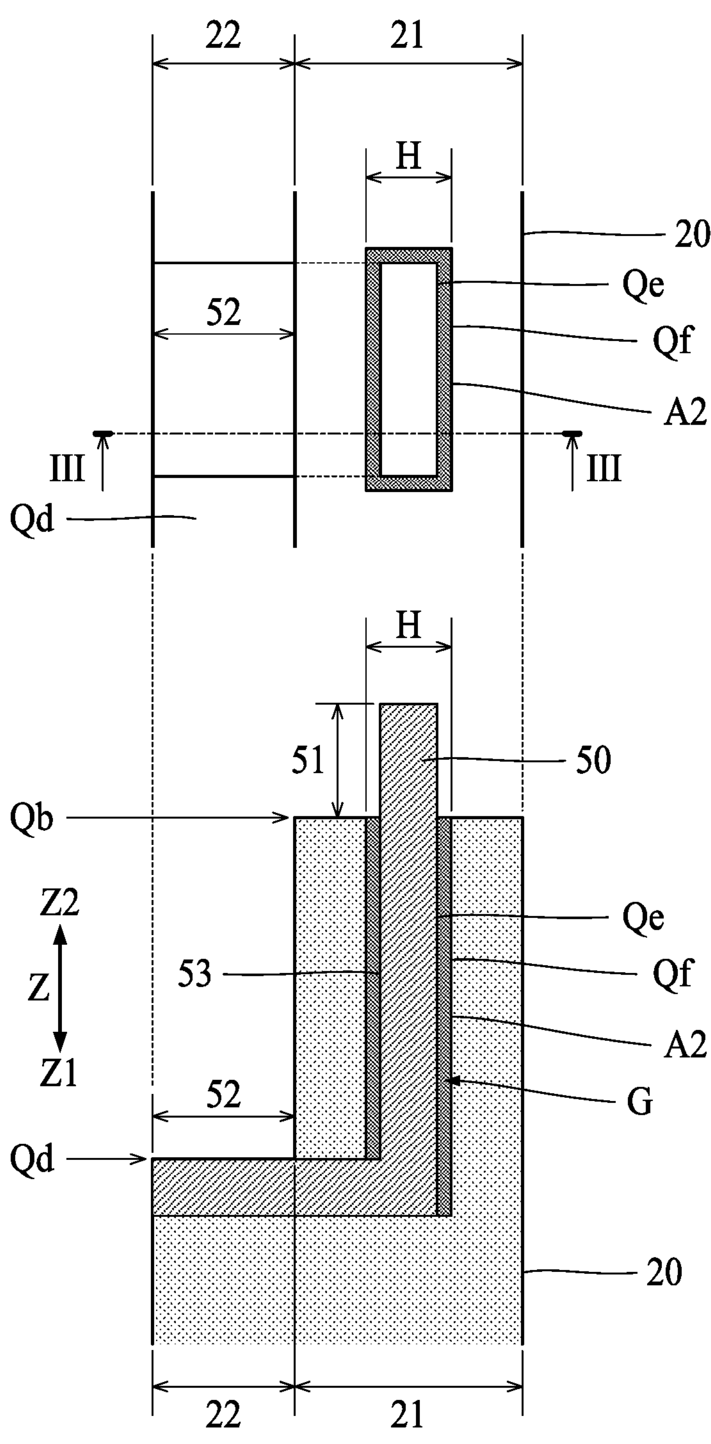
FIG. 3 is a set of an enlarged plan view of a vicinity of a connection terminal and a cross section taken along line III-III in the enlarged plan view.

FIG. 3 is a set of an enlarged plan view of a vicinity of a connection terminal 50 and a cross section taken along line III-III in the enlarged plan view. As shown in FIG. 3, the connection terminal 50 includes a terminal portion 51, a continuity portion 52, and a coupling portion 53. The terminal portion 51 is an upper portion of the connection terminal 50. The terminal portion 51 protrudes from the terminal surface Qb of the housing 20 in the direction Z2. The continuity portion 52 is a lower portion of the connection terminal 50. The continuity portion 52 is disposed on an upper surface of the protrusion 22. The continuity portion 52 has an exposed upper surface included in a "protruding surface Qd." The continuity portion 52 extends in a direction, which is perpendicular to the Z-axis, along the protruding surface Qd. The continuity portion 52 of the connection terminal 50*b* is electrically connected to the semiconductor unit 10 via either the wiring member 61 or the wire 62. The coupling portion 53 is an L-shaped portion of the connection terminal 50. The coupling portion 53 couples the terminal portion 51 and the continuity portion 52 to each other. As will be described in detail below, the coupling portion 53 is embedded in the housing 20.

The terminal surface Qb of the housing 20 has terminal holes H. Each of the terminal holes H is a through hole that passes from the terminal surface Qb through the protruding surface Qd. The coupling portion 53 of the connection terminal 50 is accommodated in a terminal hole H. In other words, the connection terminal 50 according to the first embodiment protrudes from the inside of the terminal hole H toward the outside of the terminal surface Qb.

As described above, the connection terminal 50 is integrally formed together with the housing 20 by insert molding. Thus, an outer wall surface Qe of the connection terminal 50 (coupling portion 53) is ideally in close contact with an inner wall surface Qf of the terminal hole H without a gap. However, a thermal expansion coefficient of the housing 20 is greater than a thermal expansion coefficient of the connection terminal 50, and bonding of the connection terminal 50 to the housing 20 is weak. Thus, in practice, a gap G may be provided between the outer wall surface Qe of the connection terminal 50 (coupling portion 53) and the inner wall surface Qf of the terminal hole H. The gap G is a space with a depth of 0.5 mm or more and a width of 0.001 mm or more, for example. The gap G is an example of a "space" in the present disclosure.

In the first embodiment, an adhesive A2 is accommodated in the gap G. The housing 20 and the connection terminal 50 are bonded to each other by the adhesive A2. In other words, the outer wall surface Qe of the connection terminal 50 (coupling portion 53) and the inner wall surface Qf of the terminal hole H are bonded by the adhesive A2. As with the adhesive A1, the adhesive A2 is made of a resin material having a water absorption rate of 0.5% or less in a cured state. The adhesive A2 is an example of a "second adhesive" in the present disclosure.

If an adhesive A, which is each of the adhesives A1 and A2, has a high water absorption rate, the adhesive A tends to absorb moisture. The adhesive A makes adhesion caused by hydrogen bonds. However, the hydrogen bonds may be broken by moisture. Breaking the hydrogen bonds causes detachment of a part of the adhesive A. Thus, moisture may infiltrate into the internal space S of the housing 20 from a gap formed by the detachment. The moisture that has infiltrated into the internal space S may cause damage to the semiconductor chip 12. In addition, in the course of manufacturing the semiconductor module 100, moisture absorbed by the adhesive A may be released in a high temperature environment. The moisture that has been released from the adhesive A may cause damage to the semiconductor chip 12.

The first embodiment is an aspect for solving the above problems. In other words, in the first embodiment, the adhesive A (A1, A2) has a water absorption rate of 0.5% or less. As described above, the adhesive A does not readily absorb moisture. As a result, it is possible to reduce detachment of the adhesive A caused by absorbed moisture. Thus, it is difficult for moisture to infiltrate into the internal space S. As a result, it is possible to reduce damage to the semiconductor chip 12.

For example, in the first embodiment, the water absorption rate of the adhesive A1 is 0.5% or less. Thus, it is possible to reduce failure of bonding of the heat radiating plate 30 to the housing 20, the failure being caused by absorbed moisture. Furthermore, in the first embodiment, the water absorption rate of the adhesive A2 is 0.5% or less. Thus, it is possible to reduce failure of bonding of the connection terminal 50 to the housing 20, the failure being caused by absorbed moisture. Specifically, in the first embodiment, it is difficult for moisture to infiltrate into a gap between the connection terminal 50 and the terminal hole H. Thus, it is possible to firmly bond the connection terminal 50 to the housing 20.

Figure 4:
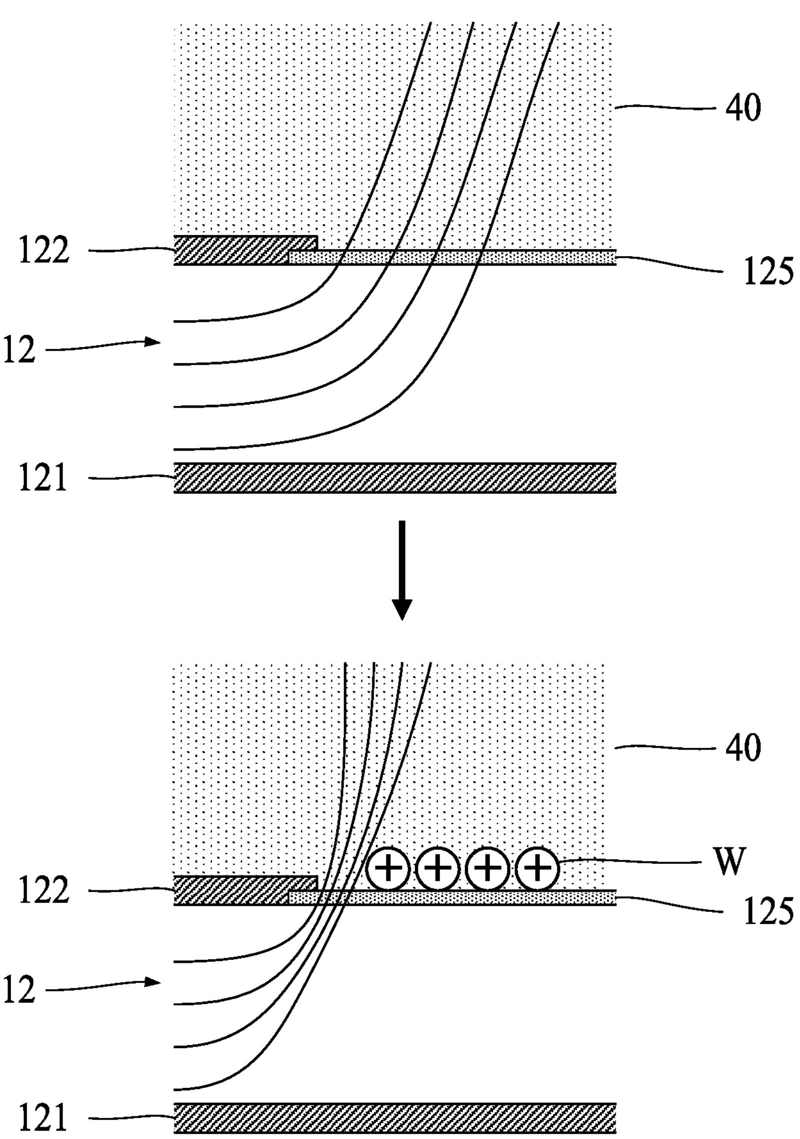
FIG. 4 is a diagram explaining damage to a semiconductor chip caused by moisture.

FIG. 4 is a diagram explaining damage to the semiconductor chip 12 caused by moisture. The semiconductor chip 12 has the semiconductor layer with an upper surface on which a protective film 125 is disposed together with the second main electrode 122 and the control electrode 123 described above. The protective film 125 is made of various resin materials such as a polyamide material.

As shown in FIG. 4, when the protective film 125 absorbs moisture that has infiltrated into the internal space S, cations W appear on a surface of the protective film 125. A potential level of the semiconductor chip 12 changes due to the cations W. Specifically, intervals of equipotential lines change due to the cations W. As a result, an electric field with a high level occurs locally. If an electric discharge occurs at a point at which the electric field with a high level occurs locally, the semiconductor chip 12 may be damaged. According to the first embodiment, infiltration of moisture into the internal space S can be reduced. As a result, it is possible to reduce damage to the semiconductor chip 12.

For example, a standard (AQG-324) for qualification tests for semiconductor modules for vehicles defines a reliability test (THB test or H3TRB test). In this reliability test, a reverse bias is applied under high-temperature and high-humidity conditions. Specifically, in this reliability test, a bias of 960 V has been applied to a product, which has a dielectric withstand voltage of 1200 V, for 1000 hours at a temperature of 85 degrees Celsius and a humidity of 85% relative humidity (RH). For a configuration in which the adhesive A has a water absorption rate of 0.5% or less, good results of the reliability test were confirmed. In view of the above results, in the first embodiment, the adhesive A having a water absorption rate of 0.5% or less is used.

Materials of Adhesive A (A1, A2)

Specific examples of a material of the adhesive A (A1, A2) having a water absorption rate of 0.5% or less will be described below. A water absorption rate of a resin material reduces with mixing of fillers into the resin material. Each of the fillers is constituted of minute particles. Each of the fillers is made of, for example, silicon oxide ($SiO_2$) material or aluminum oxide ($Al_2O_3$) material. Reduction of a water absorption rate with mixing of fillers is described in "Lowering of Water Absorption for Epoxy Resin by Addition of Silica Particles and Silane Coupling Agent", Journal of Network Polymers, Japan, Vol. 40, No. 4 (2019), by Takashi Nakamura and three others.

1. Material 1

Epoxy resin materials have high adhesive performance and high stability compared to acrylic resin materials. However, the epoxy resin materials tend to have a high water absorption rate compared to the acrylic resin materials. A material 1 is an epoxy resin material including fillers, and the epoxy resin material including fillers has a water absorption rate of 0.5% or less. Specifically, the material 1 is an epoxy resin material in which fillers are mixed at a weight rate of 40% or more, for example. More preferably, the material 1 may be an epoxy resin material in which fillers are mixed at a weight rate of 70% or more, for example.

Figure 5:
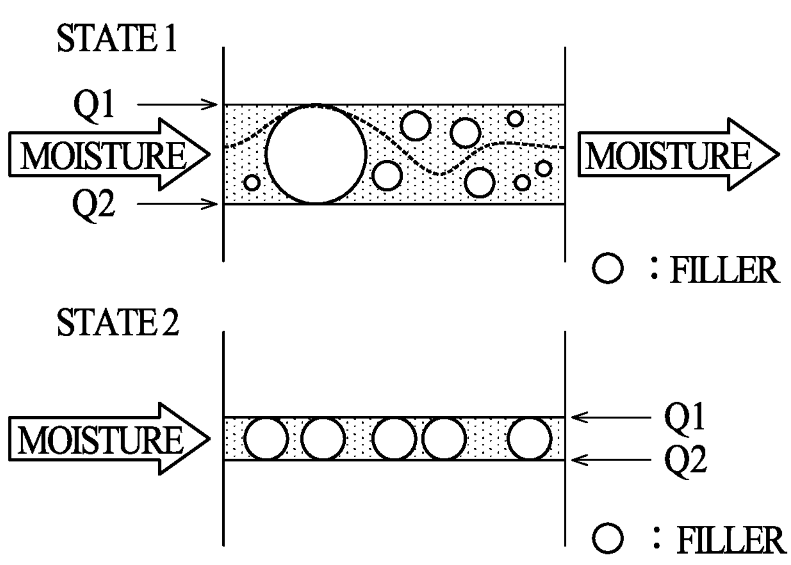
FIG. 5 is a diagram explaining a particle size of each filler included in a resin material.

FIG. 5 is a schematic diagram showing states in which a surface Q1 and a surface Q2 are bonded to each other by the material 1. In FIG. 5, a state 1 and a state 2 are depicted. In the state 1, the material 1 includes a plurality of fillers having different particle sizes. In the state 2, the material 1 includes a plurality of fillers having the same particle size. As will be understood from FIG. 5, in the state 1, a filler with a large diameter forms a space between the surface Q1 and the surface Q2. In the space between the surface Q1 and the surface Q2, fillers with small diameters are dispersed. As a result, a path for moisture can be readily formed between the surface Q1 and the surface Q2. In contrast, in the state 2, the plurality of fillers having the same particle size are densely disposed between the surface Q1 and the surface Q2. As a result, in the state 2, it is difficult for moisture to penetrate through the material 1 compared to the state 1. As described above, to reduce moisture penetrating through the material 1, the state 2 is appropriate in which the plurality of fillers have the same particle size.

In the state 1, only the filler with a large diameter is in contact with both the surface Q1 and the surface Q2, whereas the fillers with small diameters are, or are not, in contact with either the surface Q1 or the surface Q2. As a result, the surface Q1 or the surface Q2 is locally subjected to stress from the filler. In contrast, in the state 2, the plurality of fillers are in contact with both the surface Q1 and the surface Q2. As a result, the surface Q1 and the surface Q2 are subjected to uniform stress. As described above, for uniformity of stress that acts on the surface Q1 and the surface Q2, the state 2 is appropriate in which the plurality of fillers have the same particle size.

In view of the above circumstances, the material 1 according to the first embodiment includes a plurality of fillers having the same particle size. Specifically, the plurality of fillers included in the material 1 has a uniform particle size of 10 μm or less. However, the material 1 may include a plurality of fillers having different particle sizes.

2. Material 2

Acrylic resin materials have low adhesive performance and low stability compared to epoxy resin materials. However, the acrylic resin materials tend to have a low water absorption rate compared to the epoxy resin materials. A material 2 is an acrylic resin material having a water absorption rate of 0.5% or less.

3. Material 3

A material 3 is a urethane resin material including fillers, and the urethane resin material including the fillers has a water absorption rate of 0.5% or less. Specifically, the material 3 is a urethane resin material in which fillers are mixed at a weight rate of 15% or more, for example.

4. Material 4

A material 4 is an epoxy resin material to which a curing agent having a low water absorption rate is applied. As an epoxy resin material for a power module, an epoxy resin material is often used that has both a base resin including epoxy groups and a curing agent of acid anhydride. The curing agent may be methylhexahydrophthalic anhydride (Me-HHPA) or methyltetrahydrophthalic anhydride (Me-THPA), for example. Me-THPA has a lower water absorption rate compared to Me-HHPA. In view of the above tendency, the material 4 is an epoxy resin material in which Me-THPA is mixed as a curing agent. Me-THPA may be mixed as a curing agent for the material 1.

In the first embodiment, the material 1 is used as the adhesive A1 for bonding the housing 20 and the heat radiating plate 30 to each other. The material 2 is used as the adhesive A2 for bonding the housing 20 and the connection terminals 50 to each other. In a combination of the materials described above, a viscosity of the adhesive A1 before being cured is greater than a viscosity of the adhesive A2 before being cured.

As described above, the adhesive A1 is applied to the mounting surface Qc of the heat radiating plate 30. It is necessary to reduce flow of the liquid adhesive A1 applied to the mounting surface Qc (i.e., wetting spread of the adhesive A1 on the mounting surface Qc). In the first embodiment, a viscosity of the adhesive A1 is greater than a viscosity of the adhesive A2. As a result, flow of the adhesive A1 can be reduced compared to a configuration in which a viscosity of the adhesive A1 is less than a viscosity of the adhesive A2. Thus, it is easy to use the adhesive A1 at a step of bonding the housing 20 and the heat radiating plate 30 to each other.

The adhesive A2 is accommodated in the gap G. If the adhesive A2 has a high viscosity, the adhesive A2 may not sufficiently enter the gap G. In the first embodiment, a viscosity of the adhesive A2 is less than a viscosity of the adhesive A1. As a result, the adhesive A2 can sufficiently enter the gap G between the housing 20 and the connection terminal 50 compared to a configuration in which a viscosity of the adhesive A2 is greater than a viscosity of the adhesive A1.

The material of the adhesive A (A1, A2) is not limited to the above examples. For example, the adhesive A1 may be made of a material other than the material 1 (for example, any one of the materials 2 to 4). The adhesive A2 may be made of a material other than the material 2 (for example, the material 1, the material 3, or the material 4). The adhesive A may or may not include fillers.

However, the material of the adhesive A is not limited to the above examples. Resin materials including phenyl groups tend to have a low water absorption rate, for example. In view of the above tendency, the adhesive A (A1, A2) may be made of a resin material including phenyl groups. The kind of material of the adhesive A1 may be the same as the kind of material of the adhesive A2.

Manufacturing Process of Semiconductor Module 100

Figure 6:
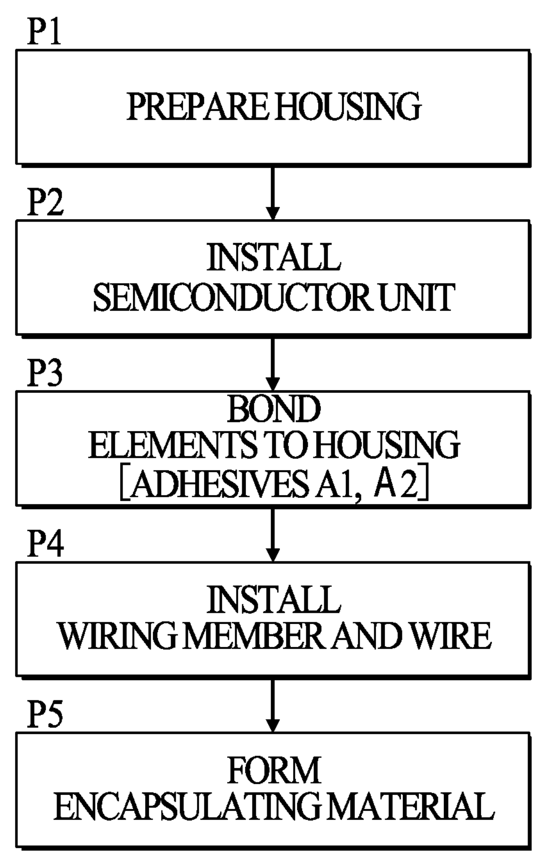
FIG. 6 is a flowchart explaining a manufacturing process of the semiconductor module.

FIG. 6 is a flowchart explaining a manufacturing process of the semiconductor module 100. At a first step P1, the housing 20 of the semiconductor module 100 is prepared. Specifically, the housing 20 and the plurality of connection terminals 50 are integrally formed together with each other by insert molding using an injection molding die. At a step P2 after the step P1, the semiconductor unit 10 is bonded to the heat radiating plate 30. The order of preparation (P1) of the housing 20 and installation (P2) of the semiconductor unit 10 may be reversed.

At a step P3 after the step P2, bonding is performed by use of the adhesive A. Specifically, at the step P3, the housing 20 and the heat radiating plate 30 are bonded to each other by the adhesive A1, and the housing 20 and the connection terminals 50 are bonded to each other by the adhesive A2.

At a step P4 after the step P3, the wiring member 61 and the wire 62 is installed. Specifically, the semiconductor chip 12 and the connection terminal 50*a* are electrically connected to each other by the wiring member 61, and the conductive pattern 114 and the connection terminal 50*b* are electrically connected to each other by the wire 62. At a step P5 after the step P4, the encapsulating material 40 is filled in the internal space S of the housing 20.

The steps (P1 to P5) described above are performed under a nitrogen atmosphere. In the nitrogen atmosphere, moisture concentration is set to 1000 ppm or less, for example. Thus, it is possible to sufficiently limit absorption of moisture by the adhesive A.

Figure 7:
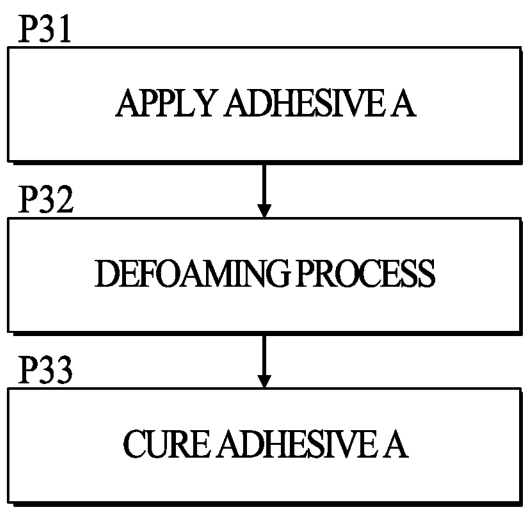
FIG. 7 is a flowchart explaining a bonding step at which an adhesive is used, the bonding step being included in the manufacturing process of the semiconductor module.

FIG. 7 is a flowchart explaining a specific example of the step P3 in which bonding is performed by use of the adhesive A. At a step P31, the adhesive A is applied. Specifically, the liquid adhesive A1 is applied to the mounting surface Qc of the heat radiating plate 30, and the liquid adhesive A2 is applied to a portion of the terminal surface Qb of the housing 20, the portion of the terminal surface Qb being around each of the connection terminals 50.

At a step P32 after the step P31, a defoaming process is performed for removing foam from the adhesive A1 and from the adhesive A2. Specifically, a space is depressurized in which the manufacturing process is performed. As a result, foam is removed from the adhesive A. When the depressurized state terminates in response to the end of the defoaming process, the adhesive A2 on the terminal surface Qb of the housing 20 is drawn into the terminal holes H. In other words, the adhesive A2 sufficiently enters the gap G between the housing 20 and each of the connection terminals 50.

At a step P33 after the step P32, the adhesive A1 and the adhesive A2 are cured by heating, for example. At the step P33, the heat radiating plate 30 and each of the connection terminals 50 are bonded to the housing 20. Curing of the adhesive A at the step P33 is performed in two stages: temporary curing and main curing. The temporary curing is a process to stabilize the adhesive A by curing of the adhesive A under a low temperature environment to react the adhesive A. The main curing is a process to improve strength and heat resistance of the adhesive A by curing of the adhesive A under a high temperature environment to complete the reaction of the adhesive A.

As described above, in the first embodiment, foam is removed from the adhesive A at the defoaming process. In addition, moisture included in the adhesive A is also removed from the adhesive A at the defoaming process. Thus, compared to a configuration in which the defoaming process is not performed, moisture in the adhesive A is reduced. As a result, it is possible to reduce detachment caused by moisture in the adhesive A. In addition, an advantage is obtained in that the adhesive A2 can be efficiently supplied into the terminal holes H at the defoaming process described above.

B: Second Embodiment

A second embodiment according to the present disclosure will be described. In the descriptions of the following embodiments, elements having the same functions as in the first embodiment are denoted by the same reference numerals used for like elements in the description of the first embodiment, and detailed description thereof is omitted, as appropriate.

Figure 8:
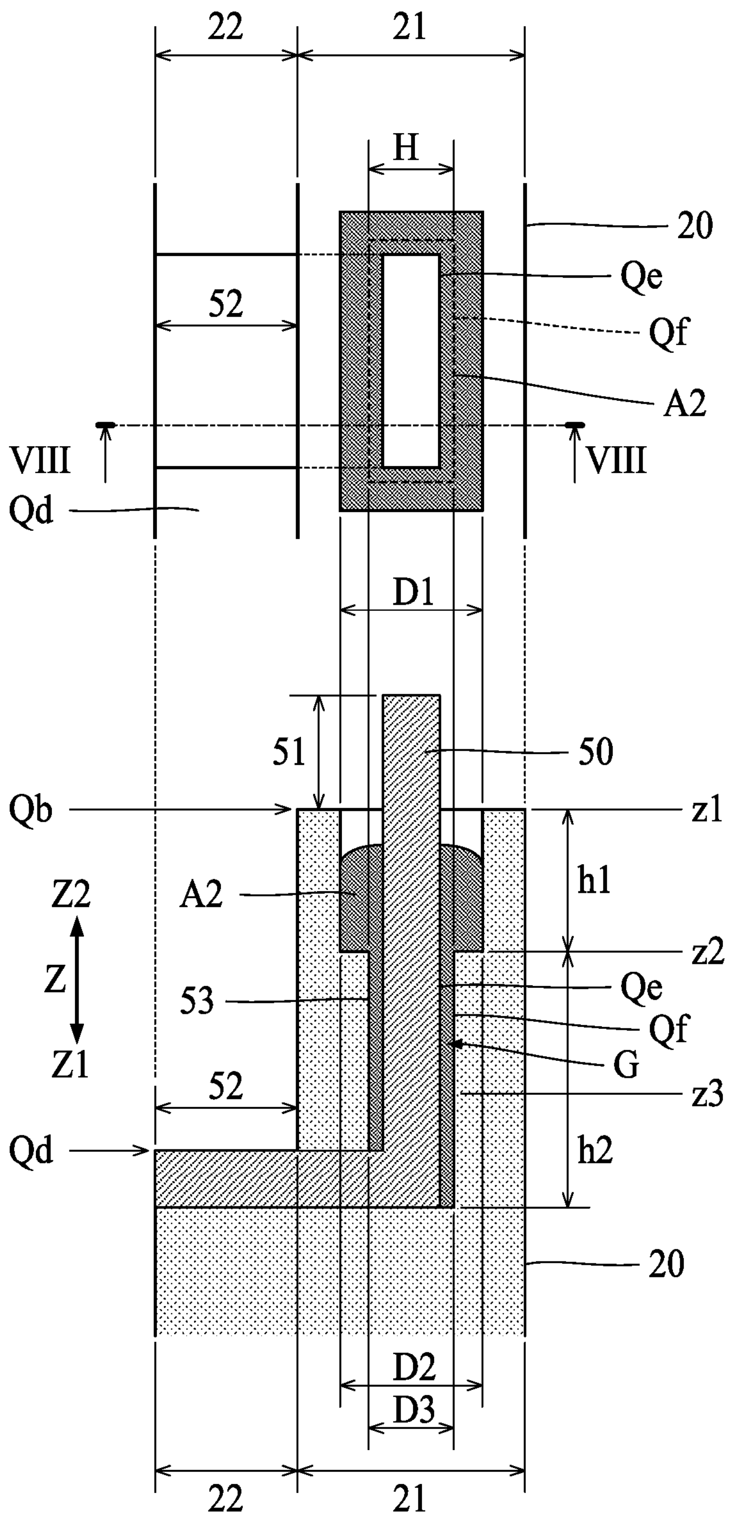
FIG. 8 is a set of an enlarged plan view of a vicinity of a connection terminal according to a second embodiment and a cross section taken along line VIII-VIII in the enlarged plan view.

FIG. 8 is a set of an enlarged plan view of a vicinity of a connection terminal 50 according to the second embodiment and a cross section taken along line VIII-VIII in the enlarged plan view. In the second embodiment, a shape of a terminal hole H for accommodating the connection terminal 50 is different from that of the first embodiment.

As shown in FIG. 8, the terminal hole H according to the second embodiment is divided into a first portion h1 and a second portion h2 in a direction of a depth of the terminal hole H. The first portion h1 of the terminal hole H ranges between a first position z1 in a direction of the Z-axis and a second position z2 in the direction of the Z-axis. The first position z1 is a position at which the terminal surface Qb of the housing 20 is present. The second position z2 is a predetermined distance away from the first position z1 in the direction of the Z-axis (specifically direction Z1 that is an example of a depth direction). The second portion h2 of the terminal hole H is other than the first portion h1 of the terminal hole H. In other words, the second portion h2 is positioned in the direction Z1 from the first portion h1. The direction of the Z-axis (particularly direction Z1) corresponds to a direction of a depth of the terminal hole H.

In FIG. 8, a third position z3 in the direction of the Z-axis is depicted. The third position z3 is a position deeper than the second position z2. In other words, the third position z3 is a position of a portion of the second portion h2 of the terminal hole H in the direction of the Z-axis. The third position z3 is an example of a "position separated in the depth direction from a position of the terminal surface Qb." As will be understood from FIG. 8, in the second embodiment, a diameter D1 of the terminal hole H at the first position z1 is greater than a diameter D3 of the terminal hole H at the third position z3 (D1>D3). A diameter D (for example, each of the diameters D1 and D3) is a diameter of the inner wall surface Qf of the terminal hole H.

In the second embodiment, the terminal hole H has a portion between the first position z1 and the second position z2. A diameter D of the portion of the terminal hole H is constant from the first position z1 toward the second position z2. In other words, the diameter D1 of the terminal hole H at the first position z1 is the same as a diameter D2 of the terminal hole H at the second position z2. In other words, a diameter D of the terminal hole H remains constant from the first position z1 to the second position z2, and the diameter D of the terminal hole H reduces to the diameter D3 at the second position z2 such that the terminal hole H has a stepped shape. An inner wall surface Qf of the first portion h1 faces the outer wall surface Qe of the connection terminal 50 at a predetermined distance. The minute gap G is provided between an inner wall surface Qf of the second portion h2 and the outer wall surface Qe of the connection terminal 50.

The adhesive A2 enters both the first portion h1 of the terminal hole H and the second portion h2 of the terminal hole H. Specifically, the adhesive A2 is accommodated not only in the gap G corresponding to the second portion h2, but also in a space between the inner wall surface Qf of the first portion h1 and the outer wall surface Qe of the connection terminal 50.

At the step P31 of the manufacturing process of the semiconductor module 100 (FIG. 7), the liquid adhesive A2 is supplied to, and is accommodated in, the first portion h1 of the terminal hole H. When the defoaming process is performed at the step P32 after the step P31, the adhesive A2 enters the gap G corresponding to the second portion h2 from the first portion h1.

The second embodiment provides the same effects as those provided by the first embodiment. In the second embodiment, the diameter D1 of the terminal hole H at the first position z1 is greater than the diameter D3 of the terminal hole H at the third position z3. Thus, compared to the first embodiment in which the liquid adhesive A2 is applied on the terminal surface Qb, the adhesive A2 can readily enter gap G between the inner wall surface Qf of the terminal hole H and the outer wall surface Qe of the connection terminal 50. For example, the first portion h1 of the terminal hole H can be used as a space for accommodating a predetermined quantity of adhesive A2 for the gap G. Thus, it is possible to effectively reduce leakages of the adhesive A2 at the step P3 at which the housing 20 and the connection terminal 50 are bonded to each other.

C: Third Embodiment

Figure 9:
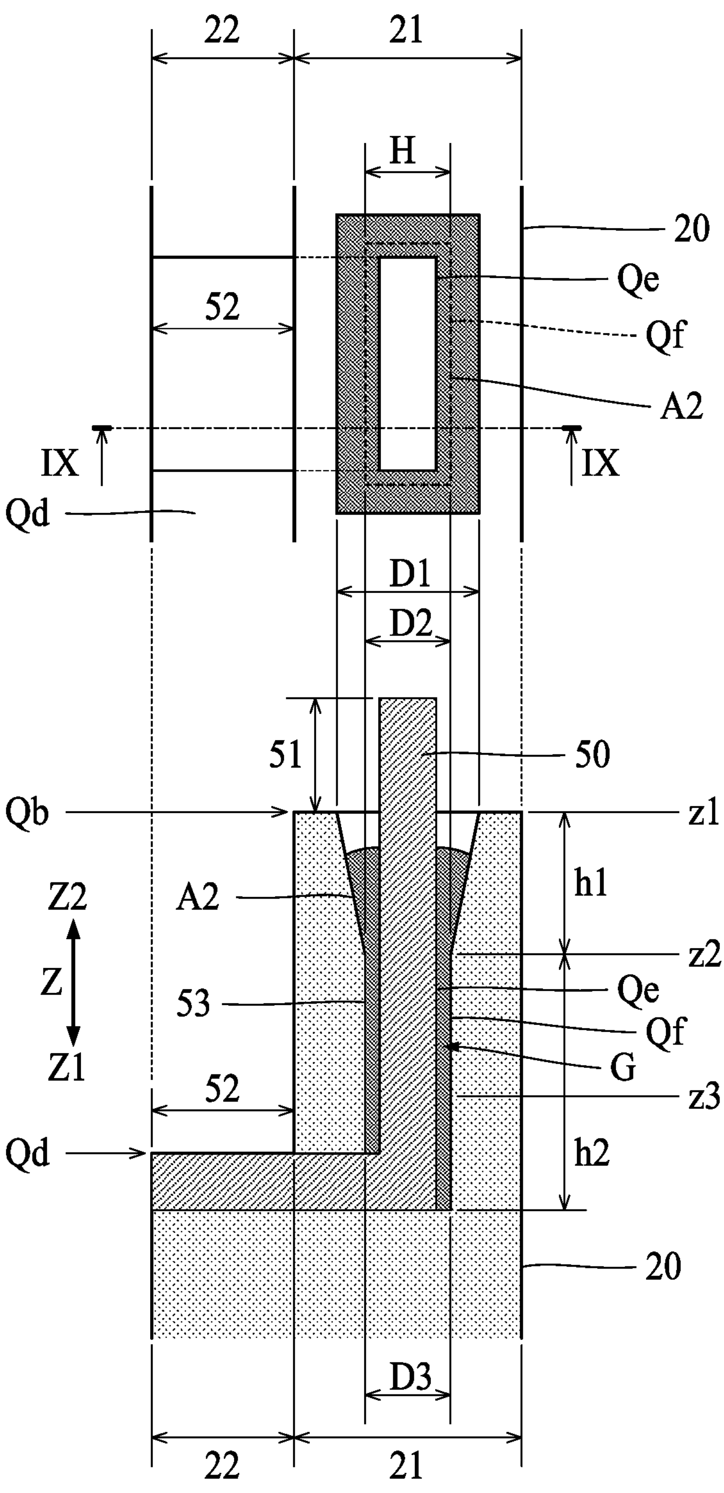
FIG. 9 is a set of an enlarged plan view of a vicinity of a connection terminal according to a third embodiment and a cross section taken along line IX-IX in the enlarged plan view.

FIG. 9 is a set of an enlarged plan view of a vicinity of a connection terminal 50 according to a third embodiment and a cross section taken along line IX-IX in the enlarged plan view. A terminal hole H according to the third embodiment includes the first portion h1 and the second portion h2 as in the second embodiment. The first portion h1 of the terminal hole H ranges between the first position z1 and the second position z2. The second portion h2 of the terminal hole H is other than the first portion h1 of the terminal hole H.

In the second embodiment, the terminal hole H has the portion between the first position z1 and the second position z2. The diameter D of the portion of the terminal hole H is constant from the first position z1 toward the second position z2. In contrast, in the third embodiment, the terminal hole H has the portion between the first position z1 and the second position z2. The diameter D of the portion of the terminal hole H reduced from the first position z1 toward the second position z2. Specifically, a diameter D of the terminal hole H linearly decreases from the diameter D1 at the first position z1 to the diameter D2 (=D3) at the second position z2. In other words, the inner wall surface Qf of the first portion h1 of the terminal hole H is a slope inclined relative to the Z-axis.

Figure 10:
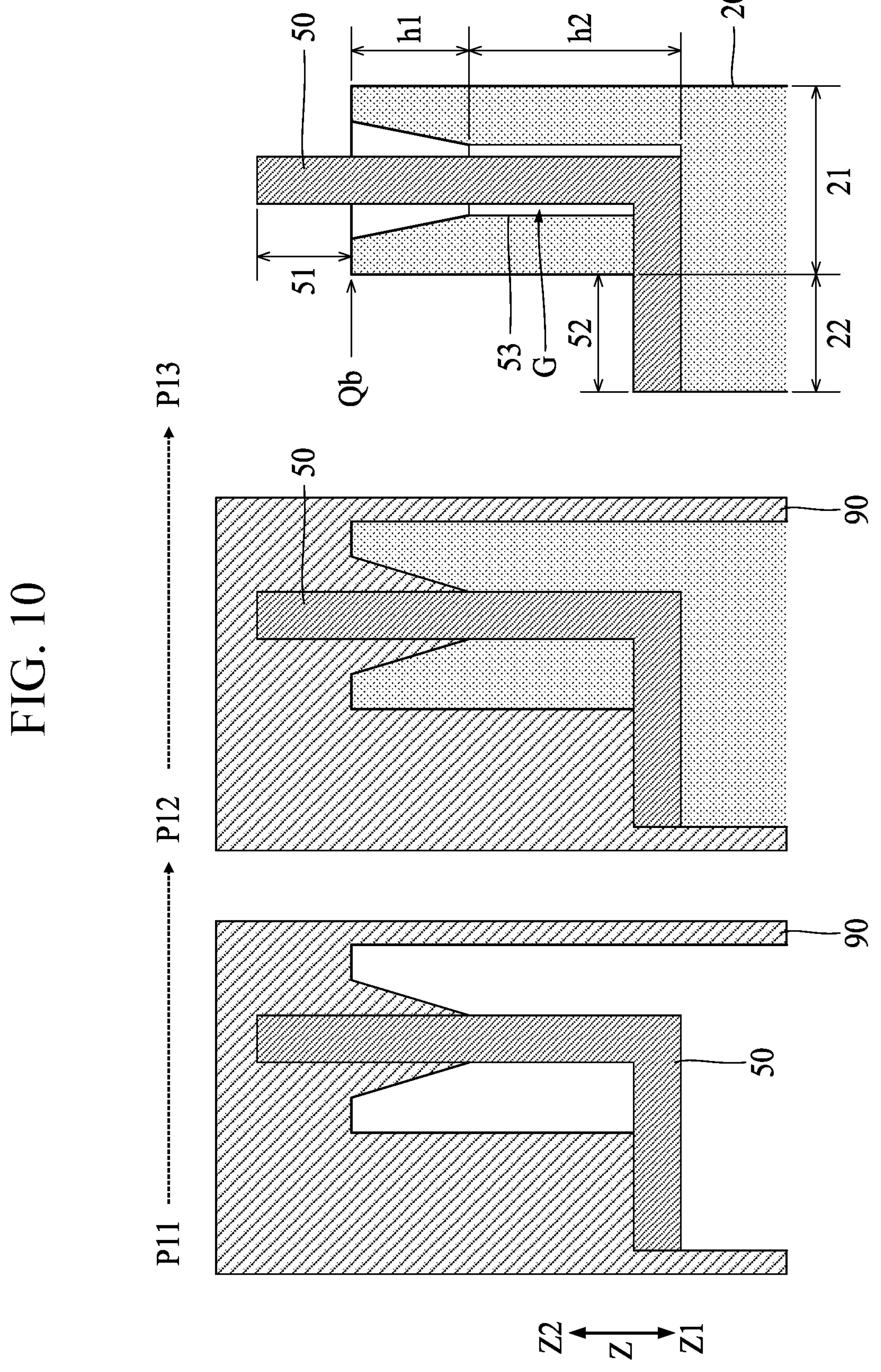
FIG. 10 is a diagram explaining the bonding step, in which the adhesive is used, according to the third embodiment.
Figure 11:
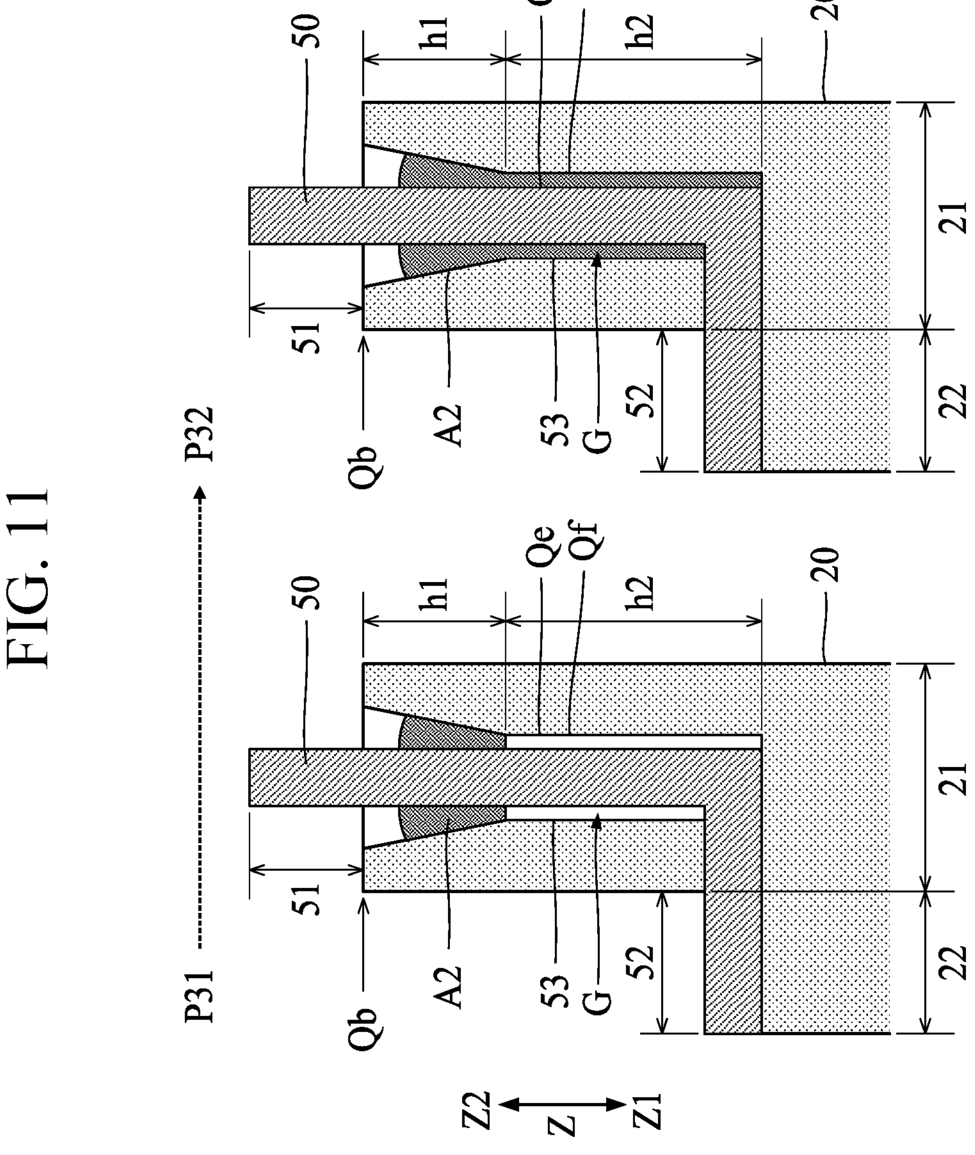
FIG. 11 is another diagram explaining the bonding step, in which the adhesive is used, according to the third embodiment.

FIG. 10 and FIG. 11 are diagrams explaining both formation of the connection terminal 50 and bonding made by the adhesive A2. In FIG. 10, a step P11 to a step P13 are included in the step P1 (in FIG. 6) at which the housing 20 is formed. In the step P11 to the step P13, the connection terminal 50 is installed. At the step P11, the connection terminal 50 is fixed to an injection molding die 90. At the step P12 after the step P11, a liquid resin material is supplied to the injection molding die 90. At the step P13 after the step P12, the housing 20 having the connection terminal 50 is released from the injection molding die 90. Due to a change in environmental temperature after the release, the gap G is formed between the outer wall surface Qe of the connection terminal 50 and the inner wall surface Qf of the terminal hole H.

After the above steps are performed, the connection terminal 50 and the housing 20 are bonded to each other by the adhesive A2. Specifically, at the step P31 shown in FIG. 11, the liquid adhesive A2 is supplied to, and is accommodated in, the first portion h1 of the terminal hole H. When the defoaming process is performed at the step P32 after the step P31, the adhesive A2 enters the gap G in the second portion h2 from the first portion h1. At the step P33 after the step P32, the adhesive A2 is cured.

The third embodiment provides the same effects as those provided by each of the first and second embodiments. In the third embodiment, the inner wall surface Qf of the terminal hole H (first portion h1) is the slope. Thus, compared to the second embodiment in which the inner wall surface Qf of the first portion h1 is parallel to the Z-axis, the liquid adhesive A2 can efficiently flow into the gap G in the terminal hole H at the step P3 at which the housing 20 and the connection terminal 50 are bonded to each other.

In the second embodiment described above, the terminal hole H has the portion between the first position z1 and the second position z2, and the diameter D of the portion of the terminal hole H is constant from the first position z1 toward the second position z2. Thus, compared to the third embodiment, sufficient space to accommodate the adhesive A2 can be obtained in the first portion h1 between the first position z1 and the second position z2. As a result, it is possible to supply gap G with a sufficient quantity of adhesive A2 to bond the housing 20 and the connection terminal 50 to each other.

D: Fourth Embodiment

Figure 12:
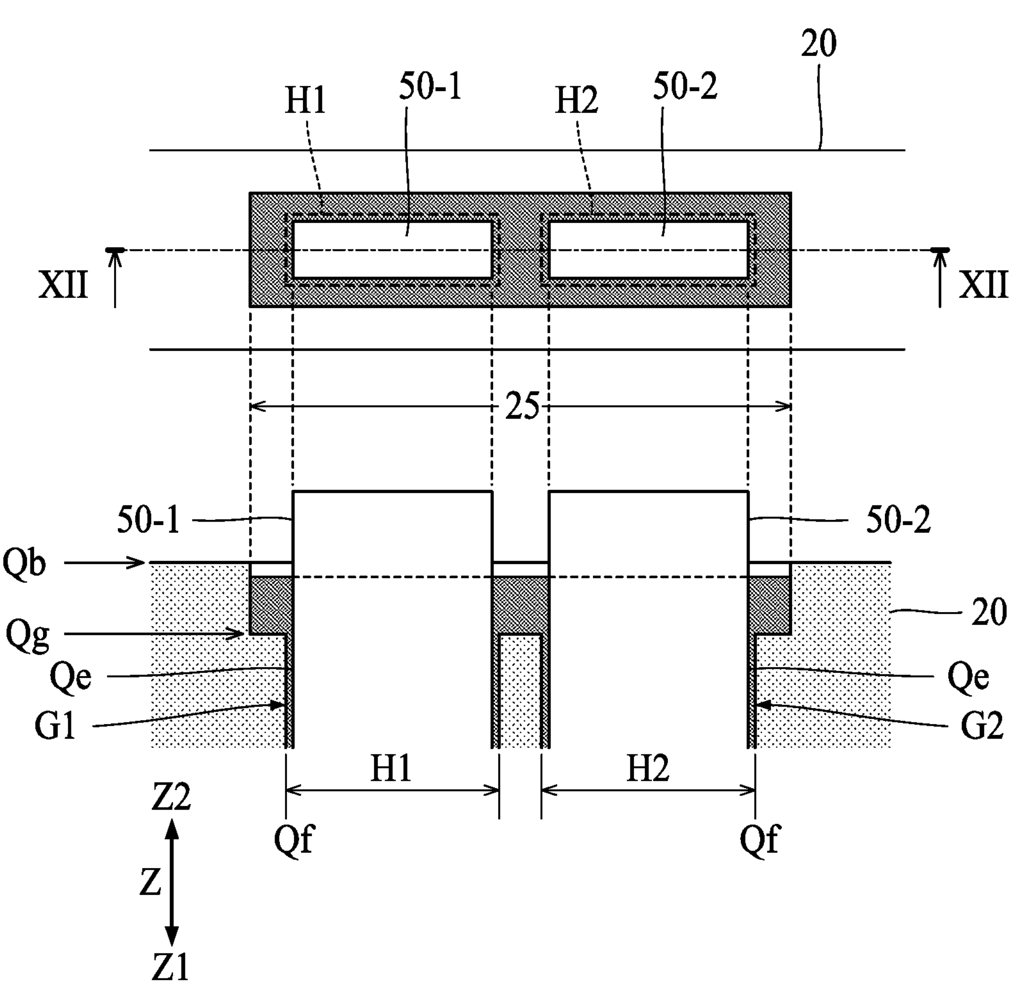
FIG. 12 is a set of an enlarged plan view of a vicinity of connection terminals according to a fourth embodiment and a cross section taken along line XII-XII in the enlarged plan view.

FIG. 12 is a set of an enlarged plan view of a vicinity of connection terminals 50 according to a fourth embodiment and a cross section taken along line XII-XII in the enlarged plan view. As shown in FIG. 12, the plurality of connection terminals 50 according to the fourth embodiment includes a first connection terminal 50-1 and a second connection terminal 50-2. For example, the first connection terminal 50-1 is a power supply terminal to which a power supply voltage of a high potential side is supplied, whereas the second connection terminal 50-2 is a power supply terminal to which a power supply voltage of a low potential side is supplied. The first connection terminal 50-1 and the second connection terminal 50-2 are bonded to the housing 20.

The terminal surface Qb of the housing 20 according to the fourth embodiment has a recess 25. In plan view, the recess 25 has a rectangular shape. The recess 25 has a bottom surface Qg positioned in the direction Z1 from the terminal surface Qb. In plan view, the recess 25 according to the fourth embodiment has a planar shape that is elongate along a row of the first connection terminal 50-1 and the second connection terminal 50-2. In plan view, the first connection terminal 50-1 and the second connection terminal 50-2 are disposed inside the recess 25.

The bottom surface Qg of the recess 25 has a first terminal hole H1 and a second terminal hole H2. The first terminal hole H1 and the second terminal hole H2 are through holes that pass through the protruding surface Qd, as with the terminal holes H according to the first embodiment to the third embodiment. The first connection terminal 50-1 protrudes from the inside of the first terminal hole H1 toward the outside of the terminal surface Qb. The second connection terminal 50-2 protrudes from the inside of the second terminal hole H2 toward the outside of the terminal surface Qb.

The adhesive A2 is accommodated in the recess 25. Some of the liquid adhesive A2 enters a gap G1 and a gap G2 on the bottom surface Qg from the recess 25. The adhesive A2 is cured with some of the liquid adhesive A2 being not only in the gap G1, but also in the gap G2. The gap G1 is a space between an outer wall surface Qe of the first connection terminal 50-1 and an inner wall surface Qf of the first terminal hole H1. The gap G2 is a space between an outer wall surface Qe of the second connection terminal 50-2 and an inner wall surface Qf of the second terminal hole H2. As will be understood from the above description, in the fourth embodiment, multiple first portions h1 corresponding to multiple connection terminals 50 are continuous with each other. In contrast, in the second embodiment, multiple first portions h1 corresponding to multiple connection terminals 50 are separate from each other. As in the first embodiment, the adhesive A2 has a water absorption rate of 0.5% or less.

The fourth embodiment provides the same effects as those provided by the first embodiment. In the fourth embodiment, the adhesive A2 is accommodated in the recess 25 having the first terminal hole H1 and the second terminal hole H2. In other words, the recess 25 is used to accommodate the adhesive A2 not only for the first connection terminal 50-1, but also for the second connection terminal 50-2. Thus, compared to a configuration in which an adhesive A2 for the first connection terminal 50-1 and an adhesive A2 for the second connection terminal 50-2 are set separately from each other, the manufacturing process of the semiconductor module 100 can be simplified. For example, in the second embodiment or in the third embodiment, the adhesive A2 needs to be separately applied for each connection terminal 50. According to the fourth embodiment, it is possible to bond the plurality of connection terminals 50 to the housing 20 by the adhesive A2 being supplied into one recess 25. In the above description, the two connection terminals 50 are focused on. However, three or more connection terminals 50 may be disposed inside the recess 25.

E: Fifth Embodiment

Figure 13:
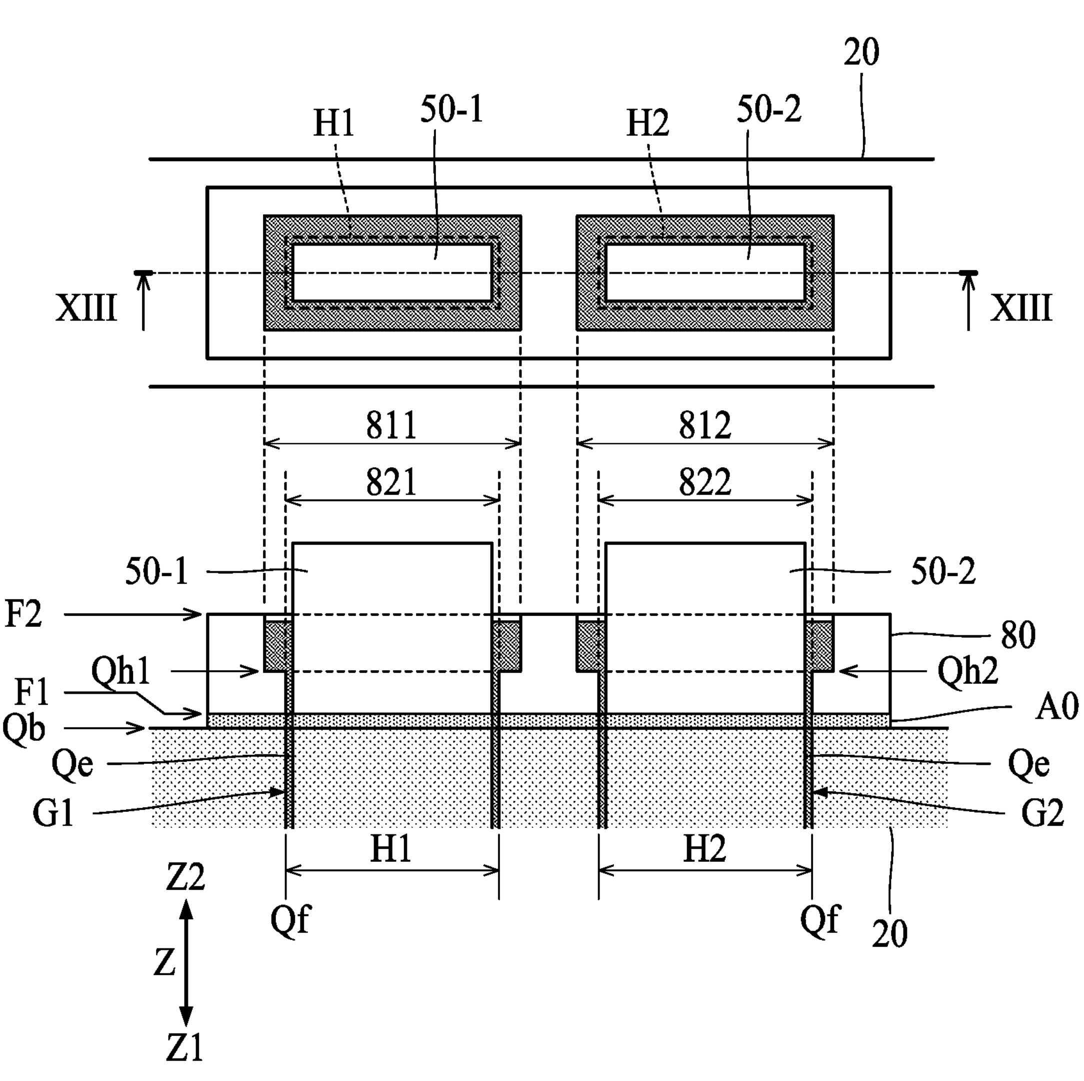
FIG. 13 is a set of an enlarged plan view of a vicinity of connection terminals according to a fifth embodiment and a cross section taken along line XIII-XIII in the enlarged plan view.

FIG. 13 is a set of an enlarged plan view of a vicinity of connection terminals 50 according to a fifth embodiment and a cross section taken along line XIII-XIII in the enlarged plan view. As shown in FIG. 13, the plurality of connection terminals 50 according to the fifth embodiment includes the first connection terminal 50-1 and the second connection terminal 50-2 as in the fourth embodiment. As in the fourth embodiment, the first connection terminal 50-1 and the second connection terminal 50-2 are bonded to the housing 20.

The semiconductor module 100 according to the fifth embodiment includes an auxiliary member 80 in addition to elements similar to those of the first embodiment. The auxiliary member 80 is a plate-shaped member with a first surface F1 and a second surface F2. The first surface F1 and the second surface F2 are provided in opposing relation to each other. Specifically, the first surface F1 is a lower surface facing in the direction Z1, whereas the second surface F2 is an upper surface facing in the direction Z2. The auxiliary member 80 may be made of a resin material of the same type as that of the housing 20, or alternatively, the auxiliary member 80 may be made of a resin material of a different type from that of the housing 20.

The terminal surface Qb of the housing 20 according to the fifth embodiment has the first terminal hole H1 and the second terminal hole H2. The first terminal hole H1 and the second terminal hole H2 are through holes that pass through the protruding surface Qd, as with the terminal holes H according to the first embodiment to the third embodiment.

The auxiliary member 80 is bonded to the housing 20. Specifically, the first surface F1 of the auxiliary member 80 is bonded to the terminal surface Qb of the housing 20. The housing 20 and the auxiliary member 80 are bonded to each other by an adhesive A0. In other words, the adhesive A0 is interposed between the first surface F1 and the terminal surface Qb. The adhesive A0 is made of a resin material having a water absorption rate of 0.5% or less in a cured state. For example, the adhesive A0 may be made of any of the materials 1 to 4 described above.

The auxiliary member 80 has a first recess 811, a second recess 812, a first communication hole 821, and a second communication hole 822. The first recess 811 and the second recess 812 are rectangular recesses on the second surface F2 of the auxiliary member 80. The first communication hole 821 is a through hole that causes the first recess 811 and the first terminal hole H1 to be in communication with each other. Specifically, the first communication hole 821 passes from a bottom surface Qh1 of the first recess 811 through the first surface F1. The second communication hole 822 is a through hole that causes the second recess 812 and the second terminal hole H2 to be in communication with each other. Specifically, the second communication hole 822 passes from a bottom surface Qh2 of the second recess 812 through the first surface F1.

The first connection terminal 50-1 protrudes from the inside of the first terminal hole H1 toward the outside of the second surface F2 via the first communication hole 821. Similarly, the second connection terminal 50-2 protrudes from the inside of the second terminal hole H2 toward the outside of the second surface F2 via the second communication hole 822. In other words, a tip of the first connection terminal 50-1 and a tip of the second connection terminal 50-2 protrude from the second surface F2 in the direction Z2.

An adhesive A2 is accommodated and cured in the first recess 811, and another adhesive A2 is accommodated and cured in the second recess 812. Some of the liquid adhesive A2 enters a gap G1 from the first recess 811. The adhesive A2 is cured with some of the liquid adhesive A2 being in the gap G1. The gap G1 include not only the space between the outer wall surface Qe of the first connection terminal 50-1 and the inner wall surface Qf of the first terminal hole H1, but also a space between the outer wall surface Qe of the first connection terminal 50-1 and an inner wall surface of the first communication hole 821. Similarly, some of the liquid adhesive A2 enters a gap G2 from the second recess 812. The adhesive A2 is cured with some of the liquid adhesive A2 being in the gap G2. The gap G2 includes not only the space between the outer wall surface Qe of the second connection terminal 50-2 and the inner wall surface Qf of the second terminal hole H2, but also a space between the outer wall surface Qe of the second connection terminal 50-2 and an inner wall surface of the second communication hole 822. As in the first embodiment, the adhesives A2 have a water absorption rate of 0.5% or less.

The fifth embodiment provides the same effects as those provided by the first embodiment. In the fifth embodiment, a liquid adhesive A2 is accommodated and cured in the first recess 811 of the auxiliary member 80, and another liquid adhesive A2 is accommodated and cured in the second recess 812 of the auxiliary member 80. Thus, an adhesive A2 can readily enter the gap G1 and another adhesive A2 can readily enter the gap G2. For example, the first recess 811 can be used as a space for accommodating a predetermined quantity of adhesive A2 for entering the gap G1, and the second recess 812 can be used as a space for accommodating a predetermined quantity of adhesive A2 for entering the gap G2. Thus, it is possible to effectively reduce leakage of the adhesive A2 at the step P3 at which the housing 20 and the connection terminals 50 are bonded to each other.

The first recess 811 and the second recess 812 may be continuous with each other. In other words, the second surface F2 of the auxiliary member 80 may have one recess not only for the first connection terminal 50-1, but also for the second connection terminal 50-2. In the above description, the two connection terminals 50 are focused on. However, three or more connection terminals 50 may be disposed at the auxiliary member 80.

F: Sixth Embodiment

Figure 14:
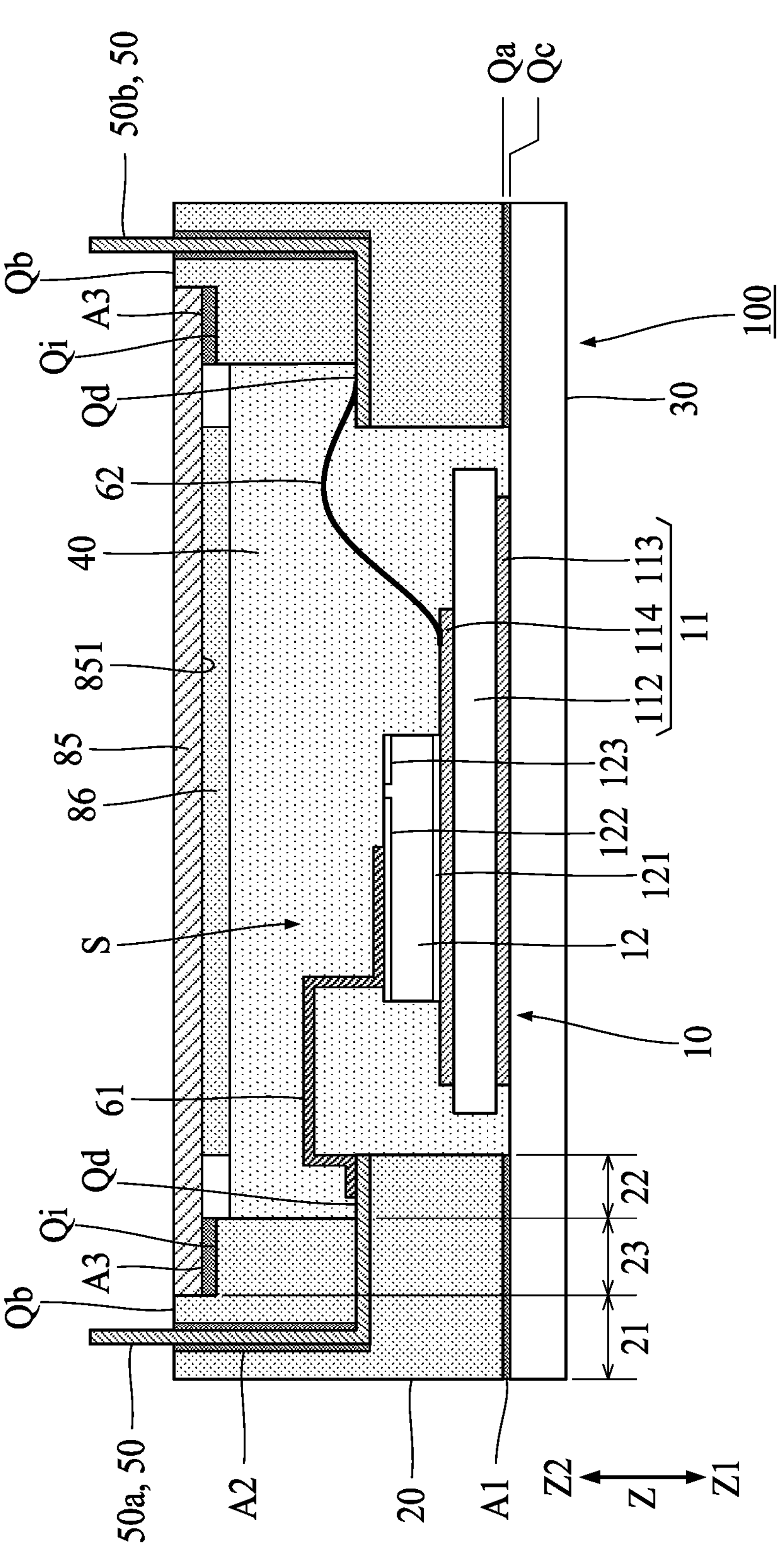
FIG. 14 is a cross section of the semiconductor module 100 according to a sixth embodiment.

FIG. 14 is a cross section of the semiconductor module 100 according to a sixth embodiment. In the sixth embodiment, a shape of the housing 20 is different from that of the first embodiment. In the first embodiment, the housing 20 includes the side wall portion 21 and the protrusion 22. In the sixth embodiment, the housing 20 includes a stepped portion 23 in addition to the side wall portion 21 and the protrusion 22.

In plan view, the stepped portion 23 is a portion provided between the side wall portion 21 and the protrusion 22. The stepped portion 23 has an upper surface (hereinafter referred to as a "stepped surface Qi") positioned between the terminal surface Qb and the protruding surface Qd in the direction of the Z-axis. In other words, the stepped portion 23 constitutes a step between the terminal surface Qb of the side wall portion 21 and the protruding surface Qd of the protrusion 22.

The semiconductor module 100 according to the sixth embodiment includes a lid 85 and a moisture absorber 86 in addition to elements similar to those of the first embodiment. The lid 85 is a plate-shaped member for closing an opening of the housing 20 (specifically an opening of the side wall portion 21). In other words, the internal space S is closed by the lid 85. The lid 85 is made of a material through which moisture cannot substantially pass. For example, the lid 85 may be made of a metallic material such as an aluminum material.

As shown in FIG. 14, the lid 85 has a lower surface 851 bonded to the stepped surface Qi of the housing 20. To bond the housing 20 and the lid 85 to each other, an adhesive A3 is used. In other words, the adhesive A3 is interposed between the lower surface 851 of the lid 85 and the stepped surface Qi. The adhesive A3 is made of a resin material having a water absorption rate of 0.5% or less in a cured state. For example, the adhesive A3 may be made of any of the materials 1 to 4 described above. The adhesive A3 is an example of a "third adhesive" in the present disclosure.

The moisture absorber 86 is a plate-shaped member interposed between the lid 85 and the encapsulating material 40. The moisture absorber 86 is made of a material having high water absorption. For example, the material of the moisture absorber 86 may be a zeolite material or a γ-alumina material, etc. The moisture absorber 86 has an upper surface that is in contact with the lower surface 851 of the lid 85. The moisture absorber 86 has a lower surface that is in contact with an upper surface of the encapsulating material 40.

Bonding of the heat radiating plate 30 to the housing 20 and bonding of the connection terminals 50 to the housing 20 are the same as those in the first embodiment. Thus, the sixth embodiment provides the same effects as those provided by the first embodiment. In the sixth embodiment, the lid 85 can reduce infiltration of moisture into the internal space S of the housing 20. The adhesive A3 having a water absorption rate of 0.5% or less is used to bond the housing 20 and the lid 85 to each other. Thus, it is possible to reduce a probability of an occurrence of detachment of the lid 85 from the housing 20 due to reaction of the adhesive A3 with moisture.

In the sixth embodiment, the moisture absorber 86 is interposed between the lid 85 and the encapsulating material 40. Thus, when moisture infiltrates from a gap between the lid 85 and the housing 20, the moisture is absorbed by the moisture absorber 86. As a result, it is possible to reduce adhesion of moisture to the semiconductor unit 10. The moisture absorber 86 may be omitted. In the sixth embodiment, the manner of bonding of each of the connection terminals 50 to the housing 20 is the same as that used in any one of the first to fifth embodiments.

G: Seventh Embodiment

Figure 15:
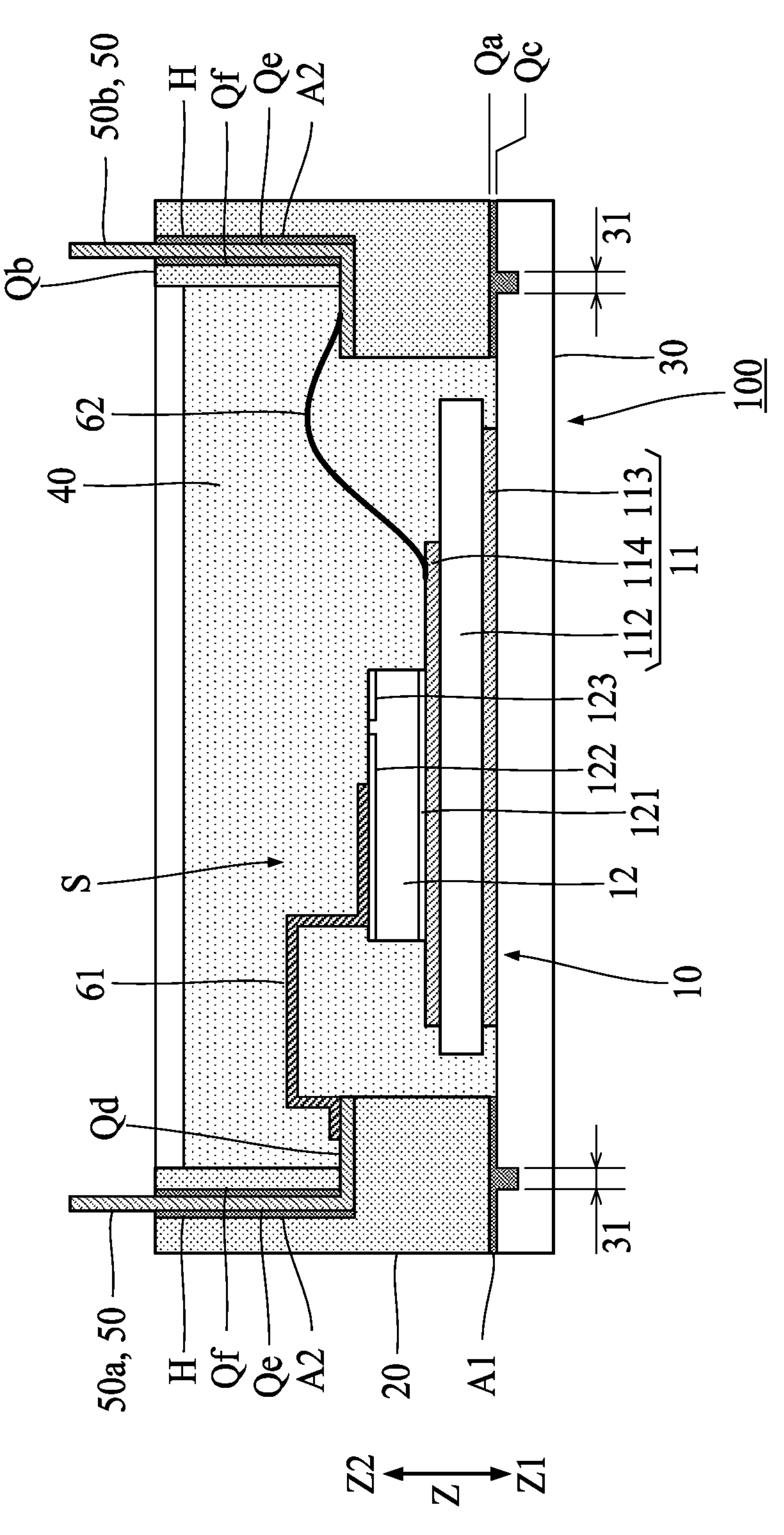
FIG. 15 is a cross section of the semiconductor module 100 according to a seventh embodiment.

FIG. 15 is a cross section of the semiconductor module 100 according to a seventh embodiment. As shown in FIG.

15, in the seventh embodiment, the mounting surface Qc of the heat radiating plate 30 has a region bonded to the housing 20. The region of the mounting surface Qc has a groove 31. The groove 31 is a recess having a rectangular frame shape along an outer shape of the housing 20. In other words, the groove 31 is covered by the housing 20 in plan view. The adhesive A1 between the housing 20 and the heat radiating plate 30 is not only interposed between the bonding surface Qa of the housing 20 and the mounting surface Qc of the heat radiating plate 30, but it is also accommodated in the groove 31 of the heat radiating plate 30.

In the seventh embodiment, elements other than the groove 31 are the same as those of the first embodiment. Thus, the seventh embodiment provides the same effects as those provided by the first embodiment. In the seventh embodiment, the adhesive A1 is accommodated in the groove 31 of the heat radiating plate 30. As a result, it is possible to reduce probability of failure of bonding due to lack of the adhesive A1, for example.

In the above description, a configuration is described in which the groove 31 is formed on the mounting surface Qc of the heat radiating plate 30. However, a groove may be formed on the bonding surface Qa of the housing 20. For example, the bonding surface Qa of the housing 20 may have a groove having a rectangular frame shape along an outer shape of the housing 20. Alternatively, the bonding surface Qa of the housing 20 and the mounting surface Qc of the heat radiating plate 30 may each have a groove. In plan view, the groove on the bonding surface Qa and the groove 31 on the mounting surface Qc may or may not overlap.

H: Modifications

Specific modified modes that may be applied to each of the embodiments described above are described below. Two or more modifications freely selected from the following modifications may be combined as long as no conflict arises from such a combination.

(1) A configuration is assumed in which either the adhesive A1 or the adhesive A2 has a water absorption rate that is greater than 0.5%. In the first embodiment, the adhesive A2 may be omitted. In the sixth embodiment (FIG. 14), a configuration is assumed in which the adhesive A3 has a water absorption rate that is greater than 0.5%.

(2) In each of the foregoing embodiments, the semiconductor chip 12 is a MOSFET having a semiconductor layer made of a silicon carbide (SiC) material. However, the semiconductor chip 12 is not limited to the example described above. The semiconductor chip 12 may be a MOSFET having a semiconductor layer made of a silicon (Si) material. Alternatively, the semiconductor chip 12 may be an element such as an insulated gate bipolar transistor (IGBT), a reverse conducting IGBT (RC-IGBT), or a Schottky barrier diode (SBD). In a configuration in which the semiconductor chip 12 comprises an IGBT, the first main electrode 121 is a collector electrode, whereas the second main electrode 122 is an emitter electrode.

(3) An element (target member) that is bonded to the housing 20 by an adhesive A that is each of the adhesives A0 to A3 having a water absorption rate of 0.5% or less is not limited to the example described above. The heat radiating plate 30 and the connection terminals 50 according to one of the first to fifth embodiments and the lid 85 according to the sixth embodiment are examples of the target member that is bonded to the housing 20 by the adhesive A having a water absorption rate of 0.5% or less.

(4) In this disclose, reference to an element using the designations "first," "second," etc., is used only for convenience in distinguishing elements, and has no substantive meaning. Thus, a position of each of the element, an order of manufacture of the elements, etc., are not limited by referring to an element using the designations "first," "second," etc.

I: Supplemental Notes

The following configurations are derivable from the foregoing embodiments.

A semiconductor module according to one aspect (first aspect) of this disclosure is a semiconductor module including: a semiconductor unit including a semiconductor chip; a housing for accommodating the semiconductor unit; and a target member bonded to the housing by an adhesive having a water absorption rate of 0.5% or less. According to this aspect, the housing and the target member are bonded to each other by the adhesive having a water absorption rate of 0.5% or less. Therefore, compared to a configuration in which the adhesive has a water absorption rate that is greater than 0.5%, it is possible to reduce detachment of the adhesive due to reaction of the adhesive with moisture (and damage to the semiconductor chip caused by the detachment).

In a specific example (second aspect) of the first aspect, the target member includes a base on which the semiconductor unit is disposed, and the housing and the base are bonded to each other by a first adhesive having a water absorption rate of 0.5% or less. According to this aspect, probability that detachment of the first adhesive will occur is reduced due to reaction of the first adhesive with moisture. Thus, it is possible to reduce risk of failure of bonding of the housing to the base.

In a specific example (third aspect) of the second aspect, the base has a surface having a region bonded to the housing, and the housing has a surface bonded to the base, and the region of the base, the surface of the housing, or both the region of the base and the surface of the housing have a groove for accommodating the first adhesive. According to this aspect, the first adhesive is accommodated in the at least one of the surfaces of the base and of the housing. Thus, it is possible to reduce probability of failure of bonding due to lack of the adhesive, for example.

In an example (fourth aspect) of any one of the first to third aspects, the target member includes a connection terminal electrically connected to the semiconductor unit, and the housing and the connection terminal are bonded to each other by a second adhesive having a water absorption rate of 0.5% or less. According to this aspect, probability that detachment of the second adhesive will occur is reduced due to moisture absorbed by the second adhesive and due to reaction of the second adhesive with moisture. Thus, it is possible to reduce risk of failure of bonding of the housing to the connection terminal.

In a specific example (fifth aspect) of the fourth aspect, the housing has a terminal surface having a terminal hole, the terminal hole having an inner wall surface, and the connection terminal protrudes from an inside of the terminal hole toward an outside of the terminal surface, the connection terminal having an outer wall surface, and the second adhesive is accommodated in a space between the inner wall surface of the terminal hole and the outer wall surface of the connection terminal. According to this aspect, it is difficult for moisture to infiltrate into a gap between the connection terminal and the terminal hole. As a result, it is possible to firmly fix the connection terminal to the housing.

In a specific example (sixth aspect) of the fifth aspect, a diameter of the terminal hole at a first position at which the terminal surface is present is greater than a diameter of the terminal hole at a position separated in a depth direction from a position of the terminal surface. According to this aspect, the diameter of the terminal hole at the first position is greater than a diameter of the terminal hole at another position. Thus, the adhesive can readily enter a gap between an inner wall surface of the terminal hole and an outer wall surface of the connection terminal.

In a specific example (seventh aspect) of the sixth aspect, the terminal hole has a portion between the first position and a second position, and the second position is away from the first position in a direction of a depth of the terminal hole, and a diameter of the portion of the terminal hole is constant from the first position toward the second position. According to this aspect, it is possible to secure a space, which is used to accommodate the second adhesive, in the portion between the first position and the second position. Thus, it is possible to supply a sufficient quantity of adhesive A2, which is required to bond the housing 20 and the connection terminal 50 to each other, to the gap between the outer wall surface of the connection terminal and the inner wall surface of the terminal hole.

In a specific example (eighth aspect) of the sixth aspect, the terminal hole has a portion between the first position and a second position, and the second position is away from the first position in a direction of a depth of the terminal hole, and diameter of the portion of the terminal hole decreases from the first position toward the second position. According to this aspect, the inner wall surface of the terminal hole is a slope. Thus, it is possible to cause the second adhesive to efficiently flow into the terminal hole at a step at which the housing and the connection terminal are to be bonded to each other.

In an example (ninth aspect) of any one of the first to eighth aspects, the target member includes a first connection terminal and a second connection terminal that are electrically connected to the semiconductor unit, and the housing has a terminal surface having a recess, and the recess has a bottom surface, the bottom surface having a first terminal hole and a second terminal hole, and the first connection terminal protrudes from an inside of the first terminal hole toward an outside of the terminal surface, and the second connection terminal protrudes from an inside of the second terminal hole toward the outside of the terminal surface, and the recess accommodates a second adhesive having a water absorption rate of 0.5% or less. According to this aspect, it is possible to reduce detachment of the first connection terminal and the second connection terminal from the housing. The second adhesive is accommodated in the recess having the bottom surface having the first terminal hole and the second terminal hole. In other words, the recess is used to accommodate the second adhesive not only for the first connection terminal, but also for the second connection terminal. Thus, compared to a configuration in which a second adhesive for the first connection terminal and a second adhesive for the second connection terminal are disposed separately, a manufacturing process of the semiconductor module can be simple.

In a specific example (tenth aspect) of the first aspect, the semiconductor module further includes an auxiliary member, the auxiliary member having a first surface and a second surface, and the target member includes a first connection terminal and a second connection terminal that are electrically connected to the semiconductor unit, and the housing has a terminal surface, the terminal surface having a first terminal hole and a second terminal hole, and the first surface is bonded to the terminal surface by an adhesive having a water absorption rate of 0.5% or less, and the auxiliary member includes: a first recess and a second recess that are on the second surface; a first communication hole causing the first recess and the first terminal hole to be in communication with each other; and a second communication hole causing the second recess and the second terminal hole to be in communication with each other, and the first connection terminal protrudes from an inside of the first terminal hole toward an outside of the second surface via the first communication hole, and the second connection terminal protrudes from an inside of the second terminal hole toward the outside of the second surface via the second communication hole, and the first recess and the second recess accommodate a second adhesive having a water absorption rate of 0.5% or less. According to this aspect, the second adhesive is accommodated not only in the first recess, but also in the second recess. Thus, the adhesive can readily enter not only a first gap, but also a second gap. The first gap has not only a space between an outer wall surface of the first connection terminal and an inner wall surface of the first terminal hole, but also a space between the outer wall surface of the first connection terminal and an inner wall surface of the first communication hole. The second gap has not only a space between an outer wall surface of the second connection terminal and an inner wall surface of the second terminal hole, but also a space between the outer wall surface of the second connection terminal and an inner wall surface of the second communication hole.

In an example (eleventh aspect) of any one of the first to tenth aspects, the target member includes: a base on which the semiconductor unit is disposed; and a connection terminal electrically connected to the semiconductor unit, and the housing and the base are bonded to each other by a first adhesive having a water absorption rate of 0.5% or less, and the housing and the connection terminal are bonded to each other by a second adhesive having a water absorption rate of 0.5% or less, and a viscosity of the first adhesive before being cured is greater than a viscosity of the second adhesive before being cured. According to this aspect, a viscosity of the first adhesive is greater than a viscosity of the second adhesive. Thus, a flow of the first adhesive can be reduced. As a result, it is easy to use the first adhesive in a step of bonding the housing and the base to each other. In addition, a viscosity of the second adhesive is less than a viscosity of the first adhesive. As a result, the second adhesive can sufficiently enter a gap between the housing and the connection terminal.

In an example (twelfth aspect) of any one of the first to eleventh aspects, the housing includes a frame-shaped side wall portion surrounding the semiconductor unit, and the target member includes a lid for closing an opening of the side wall portion, and the housing and the lid are bonded to each other by a third adhesive having a water absorption rate of 0.5% or less. According to this aspect, the lid can reduce infiltration of moisture into the internal space of the housing. The third adhesive having a water absorption rate of 0.5% or less is used to bond the housing and the lid to each other. Thus, it is possible to reduce probability of occurrence of detachment of the lid from the housing due to moisture absorbed by the third adhesive.

DESCRIPTION OF REFERENCE SIGNS

100 . . . semiconductor module, 10 . . . semiconductor unit, 11 . . . mounting substrate, 112 . . . insulating substrate, 113 . . . metallic layer, 114 . . . conductive pattern, 12 . . . semiconductor chip, 121 . . . first main electrode, 122 . . . second main electrode, 123 . . . control electrode, 125 . . . protective film, 20 . . . housing, 21 . . . side wall portion, 22 . . . protrusion, 23 . . . stepped portion, 25 . . . recess, 30 . . . heat radiating plate, 31 . . . groove, 40 . . . encapsulating material, 50 (50*a*, 50*b*) . . . connection terminal, 51 . . . terminal portion, 52 . . . continuity portion, 53 . . . coupling portion, 61 . . . wiring member, 62 . . . wire, 80 . . . auxiliary member, 811 . . . first recess, 812 . . . second recess, 821 . . . first communication hole, 822 . . . second communication hole.

What is claimed is:

1. A semiconductor module comprising:
a semiconductor unit including a semiconductor chip;
a housing for accommodating the semiconductor unit; and
a target member bonded to the housing by an adhesive having a water absorption rate of 0.5% or less, wherein the housing has a terminal surface having a terminal hole, the terminal hole having an inner wall surface, and, wherein a diameter of the terminal hole at a first position at which the terminal surface is present is greater than a diameter of the terminal hole at a position separated in a depth direction from a position of the terminal surface.

2. The semiconductor module according to claim 1,
wherein the target member includes a base on which the semiconductor unit is disposed, and
wherein the housing and the base are bonded to each other by a first adhesive having a water absorption rate of 0.5% or less.

3. The semiconductor module according to claim 2,
wherein the base has a surface having a region bonded to the housing,
wherein the housing has a surface bonded to the base, and
wherein the region of the base, the surface of the housing, or both the region of the base and the surface of the housing have a groove for accommodating the first adhesive.

4. The semiconductor module according to claim 1,
wherein the target member includes a connection terminal electrically connected to the semiconductor unit, and
wherein the housing and the connection terminal are bonded to each other by a second adhesive having a water absorption rate of 0.5% or less.

5. The semiconductor module according to claim 4,
wherein the connection terminal protrudes from an inside of the terminal hole toward an outside of the terminal surface, the connection terminal having an outer wall surface, and
wherein the second adhesive is accommodated in a space between the inner wall surface of the terminal hole and the outer wall surface of the connection terminal.

6. The semiconductor module according to claim 1,
wherein the terminal hole has a portion between the first position and a second position,
wherein the second position is away from the first position in a direction of a depth of the terminal hole, and
wherein a diameter of the portion of the terminal hole is constant from the first position toward the second position.

7. The semiconductor module according to claim 1,
wherein the terminal hole has a portion between the first position and a second position,
wherein the second position is away from the first position in a direction of a depth of the terminal hole, and
wherein a diameter of the portion of the terminal hole reduces from the first position toward the second position.

8. The semiconductor module according to claim 1,
wherein the target member includes:
a base on which the semiconductor unit is disposed; and
a connection terminal electrically connected to the semiconductor unit,
wherein the housing and the base are bonded to each other by a first adhesive having a water absorption rate of 0.5% or less,
wherein the housing and the connection terminal are bonded to each other by a second adhesive having a water absorption rate of 0.5% or less, and
wherein a viscosity of the first adhesive before being cured is greater than a viscosity of the second adhesive before being cured.

9. The semiconductor module according to claim 1,
wherein the housing includes a frame-shaped side wall portion surrounding the semiconductor unit,
wherein the target member includes a lid for closing an opening of the side wall portion, and
wherein the housing and the lid are bonded to each other by a third adhesive having a water absorption rate of 0.5% or less.

10. A semiconductor module comprising:
a semiconductor unit including a semiconductor chip;
a housing for accommodating the semiconductor unit; and
a target member bonded to the housing by an adhesive having a water absorption rate of 0.5% or less,
wherein the target member includes a first connection terminal and a second connection terminal that are electrically connected to the semiconductor unit,
wherein the housing has a terminal surface having a recess,
wherein the recess has a bottom surface, the bottom surface having a first terminal hole and a second terminal hole,
wherein the first connection terminal protrudes from an inside of the first terminal hole toward an outside of the terminal surface,
wherein the second connection terminal protrudes from an inside of the second terminal hole toward the outside of the terminal surface, and
wherein the recess accommodates a second adhesive having a water absorption rate of 0.5% or less.

11. A semiconductor module comprising:
a semiconductor unit including a semiconductor chip;
a housing for accommodating the semiconductor unit;
a target member bonded to the housing by an adhesive having a water absorption rate of 0.5% or less; and
an auxiliary member, the auxiliary member having a first surface and a second surface,
wherein the target member includes a first connection terminal and a second connection terminal that are electrically connected to the semiconductor unit,
wherein the housing has a terminal surface, the terminal surface having a first terminal hole and a second terminal hole,
wherein the first surface is bonded to the terminal surface by an adhesive having a water absorption rate of 0.5% or less,
wherein the auxiliary member includes:
a first recess and a second recess that are on the second surface;

a first communication hole causing the first recess and the first terminal hole to be in communication with each other; and a second communication hole causing the second recess and the second terminal hole to be in communication with each other, wherein the first connection terminal protrudes from an inside of the first terminal hole toward an outside of the second surface via the first communication hole, wherein the second connection terminal protrudes from an inside of the second terminal hole toward the outside of the second surface via the second communication hole, and wherein the first recess and the second recess accommodate a second adhesive having a water absorption rate of 0.5% or less.

* * * * *